US011973050B2

(12) United States Patent
Lin et al.

(10) Patent No.: US 11,973,050 B2
(45) Date of Patent: Apr. 30, 2024

(54) METHOD FOR FORMING AN UPPER CONDUCTIVE STRUCTURE HAVING MULTILAYER STACK TO DECREASE FABRICATION COSTS AND INCREASE PERFORMANCE

(71) Applicant: Taiwan Semiconductor Manufacturing Co., Ltd., Hsinchu (TW)

(72) Inventors: Tzu-Yu Lin, Hsinchu (TW); Yao-Wen Chang, Taipei (TW); Chia-Wen Zhong, Hsinchu (TW); Yen-Liang Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/336,888

(22) Filed: Jun. 2, 2021

(65) Prior Publication Data
US 2022/0246567 A1 Aug. 4, 2022

Related U.S. Application Data

(60) Provisional application No. 63/144,567, filed on Feb. 2, 2021.

(51) Int. Cl.
*H01L 23/522* (2006.01)
*H01L 21/3213* (2006.01)
(Continued)

(52) U.S. Cl.
CPC ........ *H01L 24/20* (2013.01); *H01L 21/32139* (2013.01); *H01L 23/5226* (2013.01);
(Continued)

(58) Field of Classification Search
CPC ... H01L 21/02063; H01L 24/19; H01L 24/20; H01L 2224/13019; H01L 2224/2101;
(Continued)

(56) References Cited

U.S. PATENT DOCUMENTS 6,756,671 B2 * 6/2004 Lee .................. H01L 21/76804
257/737
8,993,436 B2 * 3/2015 Ko .................... H01L 21/76831
438/740
(Continued)

FOREIGN PATENT DOCUMENTS

JP 2003273106 A 9/2003

OTHER PUBLICATIONS

Yoder et al. "Geochemical applications of the simple salt approximation to the lattice energies of complex materials" American Mineralogist (2005) 90 (2-3): 488-496, published on Feb. 1, 2005.
(Continued)

*Primary Examiner* — Khiem D Nguyen
(74) *Attorney, Agent, or Firm* — Eschweiler & Potashnik, LLC

(57) ABSTRACT

Various embodiments of the present disclosure are directed towards an integrated chip. The integrated chip includes an interconnect structure overlying a semiconductor substrate and comprising a conductive wire. A passivation structure overlies the interconnect structure. An upper conductive structure overlies the passivation structure and comprises a first conductive layer, a dielectric layer, and a second conductive layer. The first conductive layer is disposed between the dielectric layer and the passivation structure. The second conductive layer extends along a top surface of the dielectric layer and penetrates through the first conductive layer and the passivation structure to the conductive wire.

20 Claims, 16 Drawing Sheets

(51) Int. Cl.
*H01L 23/00* (2006.01)
*H01L 27/15* (2006.01)

(52) U.S. Cl.
CPC .............. *H01L 24/13* (2013.01); *H01L 24/19* (2013.01); *H01L 27/15* (2013.01); *H01L 2224/13019* (2013.01); *H01L 2224/2101* (2013.01)

(58) Field of Classification Search
CPC ............ H01L 2224/11; H01L 2224/13; H01L 2224/0401; H01L 2224/05009; H01L 2224/05025; H01L 2224/05027; H01L 21/32139; H01L 24/03; H01L 24/15; H01L 23/3192; H01L 23/5226; H01L 24/02; H01L 24/05; H01L 24/13
USPC ........................................................ 257/737
See application file for complete search history.

(56) References Cited

U.S. PATENT DOCUMENTS

| | | | |
|---|---|---|---|
| 9,129,818 | B2 | 9/2015 | Kuo et al. |
| 11,114,373 | B1* | 9/2021 | Hsiao ................ H01L 21/76877 |
| 11,211,352 | B2* | 12/2021 | Chu .................... H01L 23/3192 |
| 2004/0188851 | A1* | 9/2004 | Takewaki .......... H01L 21/76867 |
| | | | 257/E23.021 |
| 2007/0023928 | A1 | 2/2007 | Kuechenmeister et al. |
| 2008/0099913 | A1 | 5/2008 | Lehr et al. |
| 2009/0155993 | A1 | 6/2009 | Coolbaugh et al. |
| 2011/0115073 | A1 | 5/2011 | Chen |
| 2011/0140248 | A1 | 6/2011 | Tsai et al. |
| 2012/0247814 | A1* | 10/2012 | Shimizu ............... H01L 21/4857 |
| | | | 174/257 |
| 2014/0116760 | A1* | 5/2014 | Wang ................ H01L 23/53219 |
| | | | 174/250 |
| 2014/0319698 | A1* | 10/2014 | Molin .................. H01L 23/481 |
| | | | 257/774 |
| 2015/0041977 | A1* | 2/2015 | Daubenspeck ......... H01L 24/05 |
| | | | 257/737 |
| 2015/0294948 | A1 | 10/2015 | Ayotte et al. |
| 2016/0163663 | A1 | 6/2016 | Kim et al. |
| 2016/0320337 | A1* | 11/2016 | Cheng ................ G01N 27/4145 |
| 2017/0025471 | A1* | 1/2017 | Bhushan ................ H10N 50/80 |
| 2018/0211924 | A1* | 7/2018 | Andry ................ H01L 23/3192 |
| 2018/0342464 | A1 | 11/2018 | Andry et al. |
| 2019/0096831 | A1* | 3/2019 | Su ........................ H01L 23/522 |
| 2020/0126935 | A1 | 4/2020 | Wu |
| 2021/0351142 | A1* | 11/2021 | Yeh ........................ H01L 24/05 |

OTHER PUBLICATIONS

Non-Final Office Action dated Mar. 13, 2024 for U.S. Appl. No. 18/446,571.

\* cited by examiner

METHOD FOR FORMING AN UPPER CONDUCTIVE STRUCTURE HAVING MULTILAYER STACK TO DECREASE FABRICATION COSTS AND INCREASE PERFORMANCE

REFERENCE TO RELATED APPLICATION

This application claims the benefit of U.S. Provisional Application No. 63/144,567, filed on Feb. 2, 2021, the contents of which are incorporated herein by reference in their entirety.

BACKGROUND

Semiconductor chips are used in electronic and other devices and are well-known. Today's wide-spread use of such chips, and consumer demands for more powerful and more compact devices dictates that chip manufacturers continuously decrease the physical size and continuously increase the functionality of such chips. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
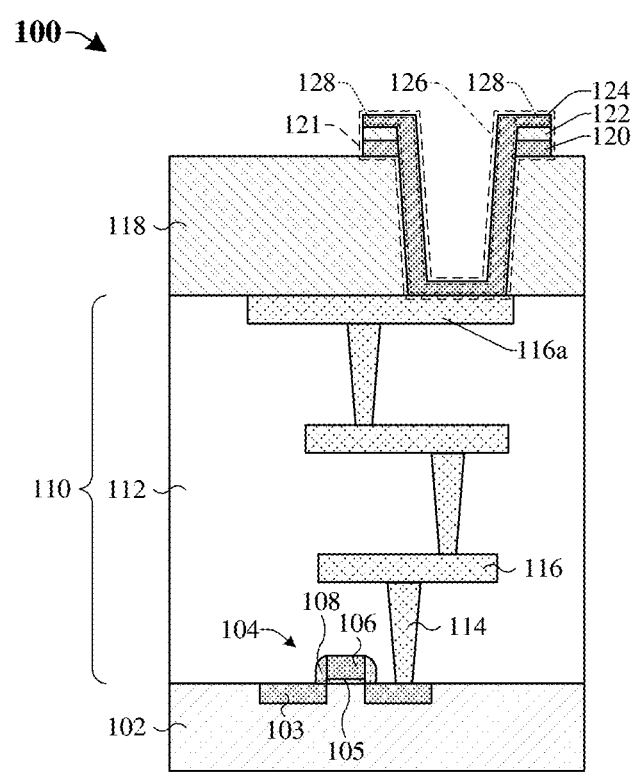
FIG. 1 illustrates a cross-sectional view of some embodiments of an integrated chip including an upper conductive structure having a multilayer stack overlying and electrically coupled to an interconnect structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chip technologies are constantly being improved. These improvements typically involve scaling down of geometries to achieve lower fabrication costs, higher device integration density, higher speeds, and better performance. Due to device scaling, the negative effects of contamination along sidewalls of a processing chamber (e.g., reduced etching rates, inconsistent etching processes, inability to precisely remove contaminants and/or by-products from substrate, etc.) are magnified.

For example, a workpiece comprising an interconnect structure over a semiconductor substrate may be loaded into a processing chamber of a plasma etching system. A passivation structure overlies a topmost conductive wire (e.g., comprising tantalum, aluminum, copper, etc.) of the interconnect structure, and a first conductive layer (i.e., a metal hard mask layer) overlies the passivation structure. The plasma processing system forms a first plasma inside the processing chamber to selectively etch the first conductive layer and the passivation structure, thereby forming an opening that exposes a top surface of the topmost conductive wire. During this process, the first plasma and/or oxygen atoms within the processing chamber react with the topmost conductive wire and results in formation of a metal oxide (e.g., tantalum oxide, aluminum oxide, copper oxide, etc.) along the top surface of the topmost conductive wire. The metal oxide may have high lattice energy (e.g., greater than about 5,000 kJ/mol) that is not easily removed by current cleaning processes. Subsequently, a cleaning process (e.g., a plasma etching process) is performed on the workpiece within the processing chamber to remove the metal oxide. During the cleaning process, the plasma processing system forms a second plasma inside the processing chamber that bombards the first conductive layer and the metal oxide, thereby facilitating removal of the metal oxide from along the topmost conductive wire. However, bombarding the first conductive layer with the second plasma causes conductive material from the first conductive layer to be re-deposited onto sidewalls and/or an upper surface of the processing chamber. The plasma processing system may include a radio frequency (RF) antenna disposed along and/or within sidewalls of the processing chamber, where the RF antenna is configured to generate electromagnetic waves that react with a processing gas (e.g., argon gas) inside the processing chamber to form the second plasma. However, as the workpiece (or subsequent workpieces) undergoes subsequent processing in the processing chamber, the re-deposited conductive material along the sidewalls and/or upper surface of the processing chamber may adversely affect the subsequent processing steps. For example, the re-deposited conductive material may cause metal-insulator-metal (MIM) capacitance/metal shielding effects that block and/or mitigate strength of the electromagnetic waves generated by the RF antenna within the processing chamber. Accordingly, the plasma processing system may not properly from plasma within the processing chamber, such that etching rates of subsequent etching processes are significantly reduced. A waferless auto-clean (WAC) process(es) may be performed to remove the conductive material from the processing chamber sidewalls and/or upper surfaces. The WAC process(es) may increase a time and costs associated with fabricating the integrated chip. Further, the WAC process(es) may be unable to effectively remove the re-deposited conductive material from the processing chamber sidewalls and/or upper surface due to a lack of physical bombardment of the conductive material, thereby increasing yield loss of the integrated chip.

In addition, after forming the opening within the first conductive layer and the passivation structure, a second conductive layer is formed over the passivation structure and lines the opening. The second conductive layer directly overlies the topmost conductive wire and is etched to define an upper conductive structure. The upper conductive structure is configured to electrically couple other semiconductor devices and/or another integrated chip to the interconnect structure. However, the re-deposited conductive material from the first conductive layer may mitigate the performance of the cleaning process (e.g., may reduce a rate the metal oxide is etched during the cleaning process), such that at least a portion of the metal oxide remains along the top surface of the topmost conductive wire. This may increase a resistance between the upper conductive structure and the topmost conductive wire, thereby increasing a resistance capacitance (RC) delay in the integrated chip.

In some embodiments, the present disclosure relates to an upper conductive structure having a multilayer stack (and an associated method of fabrication) that mitigates the re-deposition of conductive material along sidewalls and/or an upper surface of a processing chamber. A method for forming the upper conductive structure includes forming a first conductive layer (e.g., a metal hard mask layer) over a passivation structure that is disposed along a topmost conductive wire within an interconnect structure. The interconnect structure overlies a semiconductor substrate. A dielectric layer (e.g., a dielectric hard mask layer) is formed along the first conductive layer. The semiconductor substrate is loaded into the processing chamber of the plasma etching system. A patterning process is performed to selectively etch the dielectric layer, the first conductive layer, and the passivation structure to from an opening over the topmost conductive wire. During the patterning process, a metal oxide is formed along a top surface of the topmost conductive layer. Subsequently, a cleaning process is performed on the topmost conductive layer and includes forming a plasma (e.g., an argon-based plasma) inside the processing chamber. The plasma bombards the dielectric layer and the metal oxide, thereby removing the metal oxide from along the topmost conductive and reducing a thickness of the dielectric layer. The dielectric layer is configured to prevent or mitigate the plasma from reaching and/or bombarding the first conductive layer. By virtue of the dielectric layer overlying the first conductive layer, the metal oxide may be accurately removed while mitigating re-deposition of conductive material from the first conductive layer to sidewalls and/or an upper surface of the processing chamber. This reduces a number of WAC process(es) performed on the processing chamber and mitigates adverse effects to subsequent processing steps performed within the processing chamber.

Further, a second conductive layer is formed over the dielectric layer and lines the opening. Multiple etching processes are performed on the first conductive layer, the dielectric layer, and the second conductive layer (e.g., within the processing chamber) to form the upper conductive structure. The upper conductive structure comprises the multilayer stack that includes the first and second conductive layers and the dielectric layer. The accurate removal of the metal oxide ensures a good electrical connection (e.g., an Ohmic contact) between the upper conductive structure and the topmost conductive wire, thereby reducing an RC delay in the integrated chip. Further, by preventing re-deposition of conductive material from the first conductive layer, etching rates of the multiple etching processes are not adversely affected. This decreases a time and cost associated with forming the integrated chip.

FIG. 1 illustrates a cross-sectional view of some embodiments of an integrated chip 100 having an upper conductive structure 121 overlying an interconnect structure 110.

The integrated chip 100 includes the interconnect structure 110 overlying a semiconductor substrate 102. A semiconductor device 104 is disposed over and/or on the semiconductor substrate 102. The semiconductor device 104 may, for example, be a transistor or another suitable device. In some embodiments, the semiconductor device 104 comprises source/drain regions 103 disposed in the semiconductor substrate 102, a gate dielectric layer 105 disposed between the source/drain regions 103, a gate electrode 106 overlying the gate dielectric layer 105, and a sidewall spacer 108 disposed around sidewalls of the gate electrode 106 and the gate dielectric layer 105.

The interconnect structure 110 includes a plurality of conductive vias 114, a plurality of conductive wires 116, and an interconnect dielectric structure 112. The plurality of conductive vias 114 and the plurality of conductive wires 116 are disposed within the interconnect dielectric structure 112 and are configured to electrically couple the semiconductor device 104 to overlying conductive structures and/or another semiconductor device (not shown). Further, the plurality of conductive wires 116 include a topmost conductive wire 116a that directly underlies the upper conductive structure 121.

A passivation structure 118 is disposed along a top surface of the interconnect structure 110. The upper conductive structure 121 extends from a top surface of the passivation structure 118 to the topmost conductive wire 116a. In various embodiments, the upper conductive structure 121 comprises a multilayer stack that includes a first conductive layer 120, a dielectric layer 122, and a second conductive layer 124. The first conductive layer 120 is disposed along a top surface of the passivation structure 118 and is disposed between the passivation structure 118 and the dielectric layer 122. Further, the second conductive layer 124 comprises a center conductive segment 126 and a peripheral conductive segment 128 that continuously extends outwardly from the center conductive segment 126. The center conductive segment 126 continuously extends from above the dielectric layer 122, through the passivation structure 118, to the topmost conductive wire 116a. The upper conductive structure 121 is electrically coupled to the topmost conductive wire 116a by way of the center conductive segment 126. In various embodiments, the upper conductive structure 121 is configured to electrically couple the semiconductor device 104 to another integrated chip (not shown) and/or another semiconductor device (not shown).

In various embodiments, the first conductive layer 120 is configured as a metal hard mask layer, and the dielectric layer 122 is configured as a dielectric hard mask layer. The first conductive layer 120 and the dielectric layer 122 respectively directly contact outer sidewalls of the center conductive segment 126 of the first conductive layer 120. In yet further embodiments, the first conductive layer 120 and/or the dielectric layer 122 are each ring-shaped when viewed from above, such that the first conductive layer 120 and/or the dielectric layer 122 continuously laterally wraps around the center conductive segment 126. In further embodiments, the peripheral conductive segment 128 of the second conductive layer 124 is ring-shaped when viewed from above and continuously laterally wraps around the center conductive segment 126. In some embodiments, the first conductive layer 120 and the second conductive layer 124 comprise a same material (e.g., titanium nitride).

By disposing the dielectric layer 122 between the first conductive layer 120 and the second conductive layer 124, the re-deposition of conductive materials from the first conductive layer 120 onto one or more surfaces of a processing chamber and/or processing tools is mitigated during fabrication of the integrated chip 100. By mitigating the re-deposition of conductive materials from the first conductive layer 120, a resistance between the upper conductive structure 121 and the topmost conductive wire 116a is reduced. For example, mitigating the re-deposition of conductive materials facilitates proper performance of a cleaning process (e.g., a plasma etching process) utilized to remove a metal oxide from along a top surface of the topmost conductive wire 116a before forming the second conductive layer 124, and reduces WAC process(es) performed on the processing chamber and/or the processing tools to remove the re-deposited conductive materials. This, in part, reduces a resistance capacitance (RC) delay in the integrated chip 100, and decreases yield loss, time, and costs associated with fabricating the integrated chip 100.

Figure 2A:
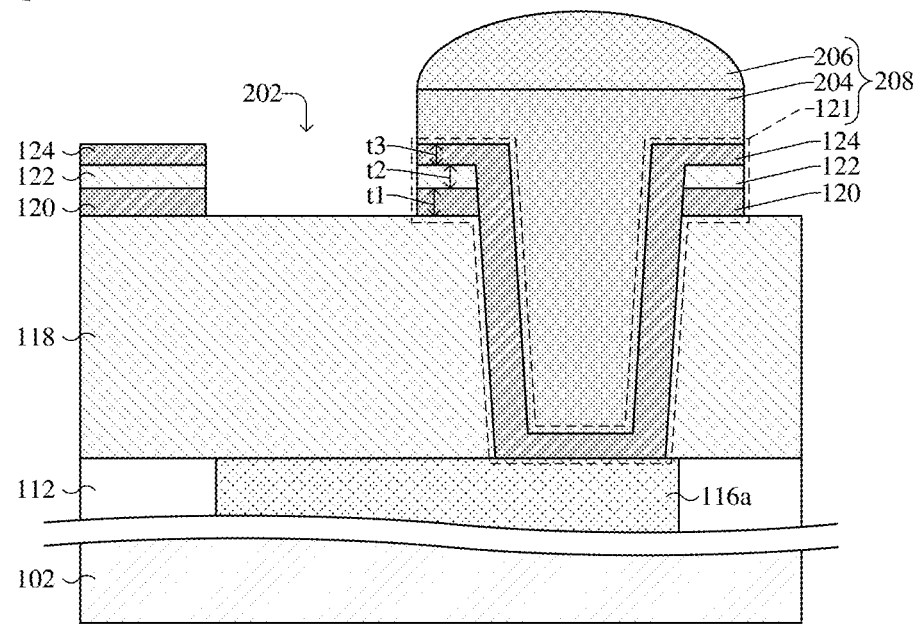
FIGS. 2A-2E illustrate cross-sectional views of some embodiments of an integrated chip comprising a bonding structure having an upper conductive structure that overlies an interconnect structure.

FIG. 2A illustrates a cross-sectional view of some embodiments of an integrated chip 200a having an upper conductive structure 121 overlying a topmost conductive wire 116a.

The topmost conductive wire 116a is disposed within an interconnect dielectric structure 112 and overlies a semiconductor substrate 102. In various embodiments, the topmost conductive wire 116a and the interconnect dielectric structure 112 are part of an interconnect structure (e.g., 110 of FIG. 1) that overlies the semiconductor substrate 102. In some embodiments, the interconnect dielectric structure 112 may, for example, be or comprise silicon dioxide, a low-k dielectric material, another suitable dielectric material, or any combination of the foregoing. As used herein, a low-k dielectric material is a dielectric material with a dielectric constant less than 3.9. In yet further embodiments, the topmost conductive wire 116a may, for example, be or comprise aluminum, titanium, tantalum, ruthenium, zirconium, molybdenum, another conductive material, or any combination of the foregoing.

A passivation structure 118 is disposed along a top surface of the interconnect dielectric structure 112 and comprises opposing sidewalls that define a trench in the passivation structure 118. In various embodiments, the opposing sidewalls of the passivation structure 118 are slanted relative to a top surface of the topmost conductive wire 116a. In various embodiments, the passivation structure 118 may, for example, be or comprise silicon dioxide, silicon glass, un-doped silicon glass, another dielectric material or the like. The upper conductive structure 121 is disposed within the trench of the passivation structure 118 and directly overlies the topmost conductive wire 116a. The upper conductive structure 121 includes a first conductive layer 120, a dielectric layer 122, and a second conductive layer 124. The first conductive layer 120 is disposed along a top surface of the passivation structure 118, and the dielectric layer 122 is disposed along the top surface of the first conductive layer 120. In various embodiments, the second conductive layer 124 extends from a top surface of the dielectric layer 122, along the first conductive layer 120 and the opposing sidewalls of the passivation structure 118 to the topmost conductive wire 116a.

In various embodiments, the first conductive layer 120 and the second conductive layer 124 may, for example, respectively be or comprise titanium nitride, aluminum, copper, tantalum nitride, another suitable conductive material, or any combination of the foregoing. In yet further embodiments, the first and second conductive layers 120, 124 comprise a same conductive material (e.g., titanium nitride) and respectively have columnar grains. In yet further embodiments, the dielectric layer 122 may, for example, be or comprise silicon dioxide, silicon nitride, aluminum oxide, silicon oxynitride, another suitable dielectric material, or any combination of the foregoing.

In some embodiments, the first conductive layer 120 has a first thickness t1 within a range of about 50 Angstroms to about 100 Angstroms, or another suitable value. In some embodiments, if the first thickness t1 is relatively low (e.g., less than about 50 Angstroms), then the passivation structure 118 may be damaged by an etching process (e.g., plasma etching process) utilized to form the trench in the passivation structure 118. In yet further embodiments, if the first thickness t1 is relatively large (e.g., greater than about 100 Angstroms), then the etching process utilized to form the trench in the passivation structure 118 may not expose a sufficient portion of the topmost conductive wire 116a. This may increase a resistance between the upper conductive structure 121 and the topmost conductive wire 116a.

In yet further embodiments, the dielectric layer 122 has a second thickness t2 within a range of about 100 Angstroms to about 500 Angstroms, or another suitable value. In yet further embodiments, by virtue of the second thickness t2 and/or the layout of the dielectric layer 122, re-deposition of conductive materials from the first conductive layer 120 onto one or more surfaces of a processing chamber and/or processing tools utilized to fabricate the integrated chip 200a is reduced. Further, the dielectric layer 122 protecting the first conductive layer 120 facilitates performance of a cleaning process performed on a surface of the topmost conductive wire 116a before depositing the second conductive layer 124 to remove a metal oxide formed along the surface of the topmost conductive wire 116a during previous processing steps. This, in part decreases a resistance between the upper conductive structure 121 and the topmost conductive wire 116a. In various embodiments, if the second thickness t2 is relatively low (e.g., less than about 100 Angstroms), then the first conductive layer 120 and/or the passivation structure 118 may be damaged by the etching process utilized to form the trench in the passivation structure 118. In yet further embodiments, if the second thickness t2 is relatively large (e.g., greater than about 500 Angstroms), then the etching process utilized to form the trench in the passivation structure 118 may not expose a sufficient portion of the topmost conductive wire 116a. This may increase a resistance between the upper conductive structure 121 and the topmost conductive wire 116a. In some embodiments, the first thickness t1 of the first conductive layer 120 is less than the second thickness t2 of the dielectric layer 122.

In various embodiments, a third thickness t3 of the second conductive layer 124 is within a range of about 150 Angstroms to about 500 Angstroms, or another suitable value. In some embodiments, if the third thickness t3 is relatively low (e.g., less than about 150 Angstroms), then a resistance between the second conductive layer 124 and the topmost conductive wire 116a is increased. In yet further embodiments, if the third thickness t3 is relatively large (e.g., greater than about 500 Angstroms), then an etching process utilized to form the upper conductive structure 121 may over-etch into underlying layers and/or structures. In some embodiments, the third thickness t3 is greater than the first thickness t1 and is greater than the second thickness t2. In yet further embodiments, the third thickness t3 is greater than the second thickness t2, and the second thickness t2 is greater than the first thickness t1.

In yet further embodiments, the upper conductive structure 121 is configured as a bond pad and is part of a bonding structure 208. In such embodiments, the bonding structure 208 includes: the upper conductive structure 121 extending through the passivation structure 118 and contacting the topmost conductive wire 116a, a bond bump structure 204 disposed over the upper conductive structure 121, and a solder ball 206 disposed along the bond bump structure 204. In some embodiments, the bonding structure 208 is configured to electrically couple the integrated chip 200a to another semiconductor structure (not shown). In yet further embodiments, the second conductive layer 124 of the upper conductive structure 121 may be configured as an upper conductive via structure. Further, an opening 202 is disposed laterally adjacent to the upper conductive structure 121, where the opening exposes a top surface of the passivation structure 118. In addition, the upper conductive structure 121 is laterally offset from and/or electrically isolated from peripheral segments of the first conductive layer 120, the dielectric layer 122, and the second conductive layer 124. Furthermore, in some embodiments, outer sidewalls of the first conductive layer 120, outer sidewalls of the dielectric layer 122, and outer sidewalls of the second conductive layer 124 of the upper conductive structure 121 are substantially straight and are respectively aligned with one another.

Figure 2B:
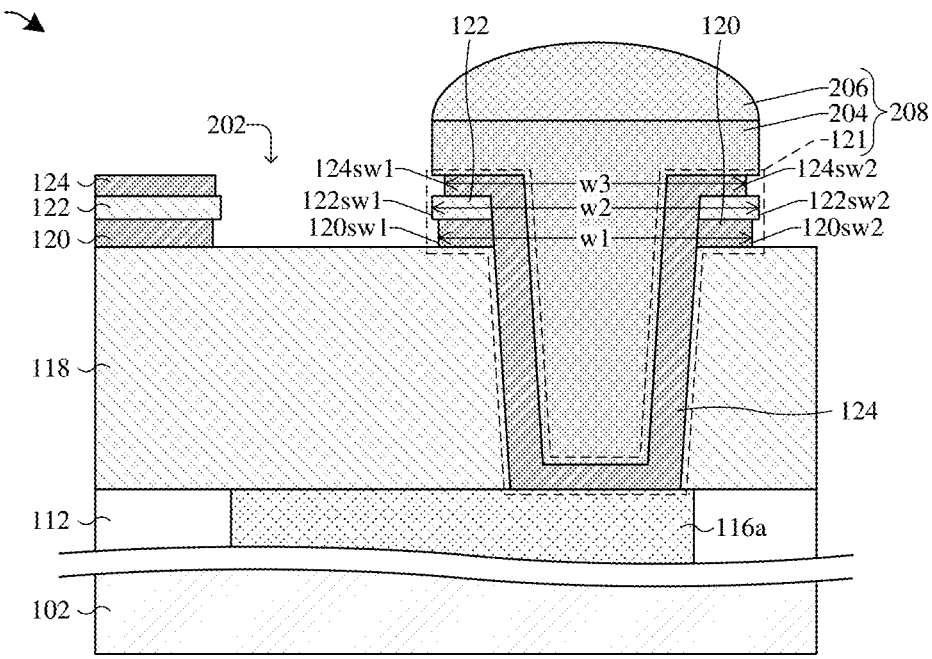

FIG. 2B illustrates a cross-sectional view of some embodiments of an integrated chip 200b corresponding to some embodiments of the integrated chip 200a of FIG. 2A.

As illustrated in FIG. 2B, the first conductive layer 120 of the conductive structure 121 has a first width w1 defined between opposing sidewalls 120sw1, 120sw2 of the first conductive layer 120. The dielectric layer 122 of the conductive structure 121 has a second width w2 defined between opposing sidewalls 122sw1, 122sw2 of the dielectric layer 122. The second conductive layer 124 of the conductive structure 121 has a third width w3 defined between opposing sidewalls 124sw1, 124sw2 of the second conductive layer 124. In various embodiments, the first width w1 is less than the second width w2 and is greater than the third width w3. In some embodiments, the first width w1 is less than the second width w2 because the upper conductive structure 121 is formed by one or more wet etch processes that bevels and/or recesses the opposing sidewalls 120sw1, 120sw2 of the first conductive layer 120 and/or the opposing sidewalls 124sw1, 124sw2 of the second conductive layer 124.

Figure 2C:
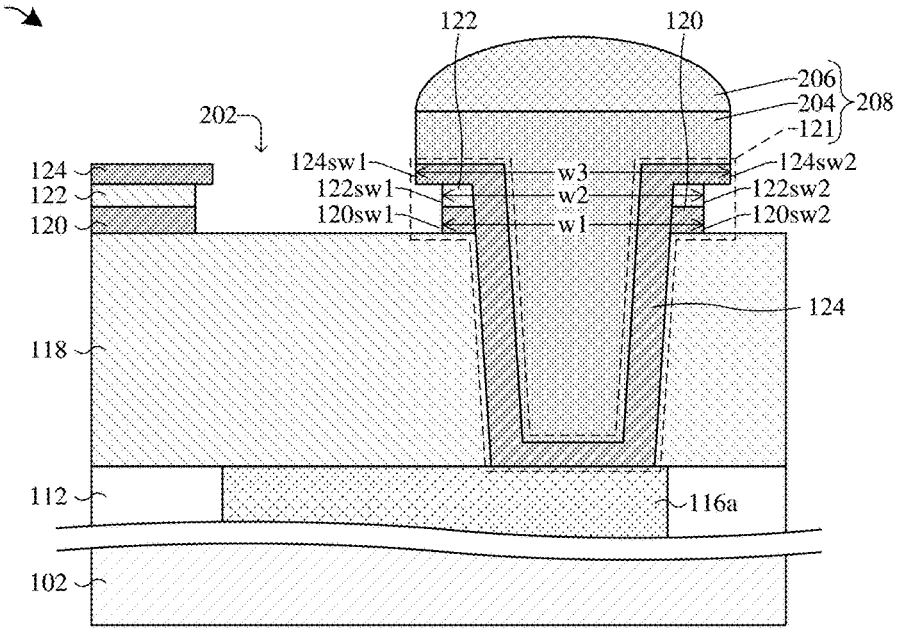

FIG. 2C illustrates a cross-sectional view of some embodiments of an integrated chip 200c corresponding to some embodiments of the integrated chip 200a of FIG. 2A.

As illustrated in FIG. 2C, in some embodiments, the first width w1 of the first conductive layer 120 is equal to the second width w2 of the dielectric layer 122. In such embodiments, the opposing sidewalls 120sw1, 120sw2 of the first conductive layer 120 are aligned with the opposing sidewalls 122sw1, 122sw2 of the dielectric layer 122. In yet further embodiments, the third width w3 of the second conductive layer 124 is greater than the first width w1 and the second width w2.

Figure 2D:
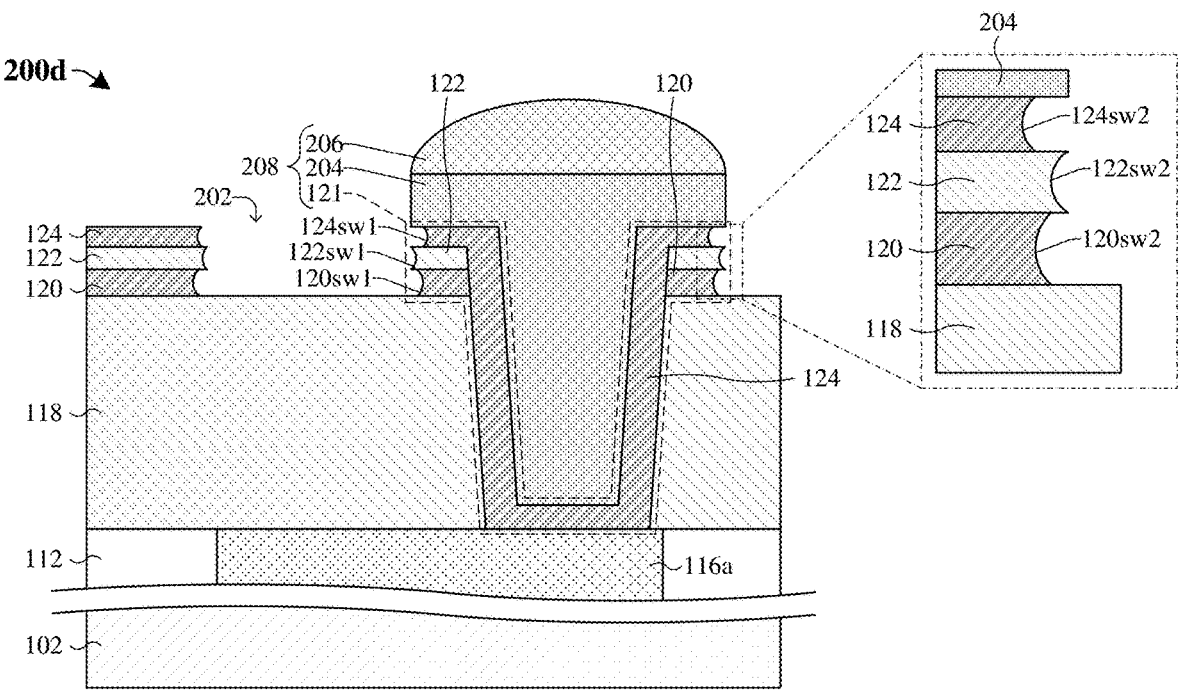

FIG. 2D illustrates a cross-sectional view of some embodiments of an integrated chip 200d corresponding to some embodiments of the integrated chip 200a of FIG. 2A.

As illustrated in FIG. 2D, in some embodiments, the opposing sidewalls 120sw1, 120sw2 of the first conductive layer 120, the opposing sidewalls 122sw1, 122sw2 of the dielectric layer 122, and the opposing sidewalls 124sw1, 124sw2 of the second conductive layer 124 are each curved, concave, and/or recessed in a direction towards a center of the upper conductive structure 121.

Figure 2E:
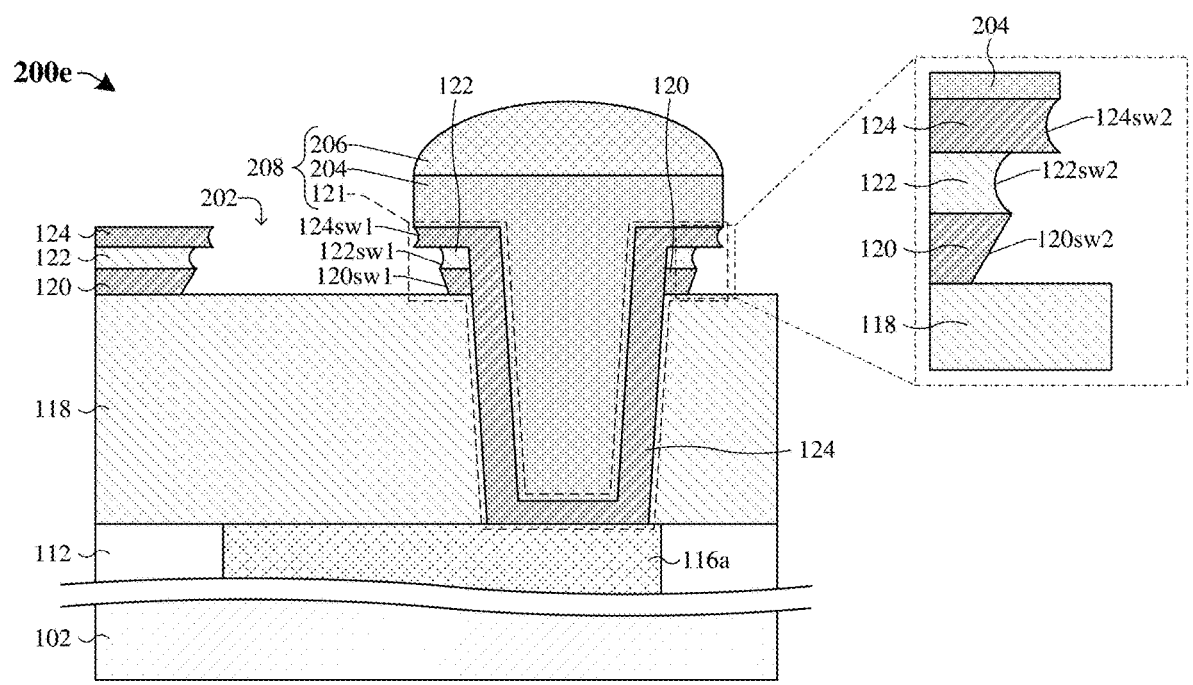

FIG. 2E illustrates a cross-sectional view of some embodiments of an integrated chip 200e corresponding to some embodiments of the integrated chip 200a of FIG. 2A.

As illustrated in FIG. 2E, in some embodiments, the opposing sidewalls 120sw1, 120sw2 of the first conductive layer 120 are straight and may be slanted relative to a top surface of the passivation structure 118. In yet further embodiments, the opposing sidewalls 122sw1, 122sw2 of the dielectric layer 122 and the opposing sidewalls 124sw1, 124sw2 of the second conductive layer 124 are curved and/or recessed in a direction towards a center of the upper conductive structure 121.

Figure 3:
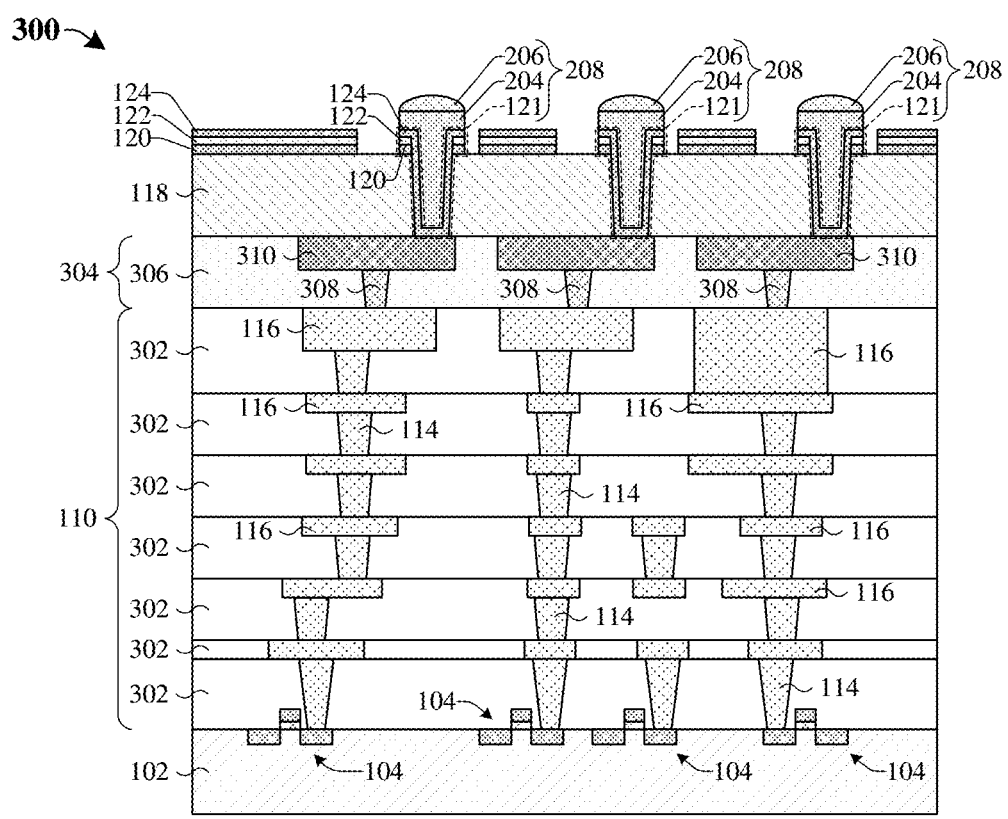
FIG. 3 illustrates a cross-sectional view of some embodiments of an integrated chip including a redistribution structure overlying an interconnect structure, and an upper conductive structure overlying the redistribution structure.

FIG. 3 illustrates a cross-sectional view of some embodiments of an integrated chip 300 including a redistribution structure 304 overlying an interconnect structure 110, and a plurality of upper conductive structures 121 overlying the redistribution structure 304.

The integrated chip 300 includes an interconnect structure 110 overlying a semiconductor substrate 102, and a redistribution structure 304 disposed over the interconnect structure 110. In some embodiments, the semiconductor substrate 102 may, for example, be or comprise a bulk substrate (e.g., a bulk silicon substrate), a silicon-on-insulator (SOI) substrate, or the like. A plurality of semiconductor devices 104 is disposed along and/or within a front-side surface of the semiconductor substrate 102. In various embodiments, the plurality of semiconductor devices 104 may each be configured as a transistor, another semiconductor device, or the like. Further, the interconnect structure 110 comprises a plurality of conductive vias 114 and a plurality of conductive wires 116 disposed within an interconnect dielectric structure. In various embodiments, the interconnect dielectric structure comprises a plurality of interconnect dielectric layers 302 that may, for example, each be or comprise an inter-level dielectric (ILD) layer, an inter-metal dielectric (IMD) layer, a dielectric protection layer, another suitable layer, or the like. The conductive vias 114 and the conductive wires 116 are configured to electrically couple the semiconductor devices 104 to the redistribution structure 304.

The redistribution structure 304 includes a lower passivation layer 306, a plurality of redistribution vias 308, and a plurality of redistribution wires 310. The lower passivation layer 306 is disposed between the passivation structure 118 and the interconnect structure 110. The redistribution vias 308 and the redistribution wires 310 are disposed within the lower passivation layer 306 and are configured to electrically couple the interconnect structure 110 to a plurality of bonding structures 208 that overlies the redistribution structure 304. In various embodiments, the plurality of redistribution vias 308 may, for example, be or comprise aluminum, copper, titanium nitride, tantalum nitride, tungsten, another conductive material, or any combination of the foregoing. In further embodiments, the plurality of redistribution wires 310 may, for example, be or comprise aluminum, titanium, tantalum, ruthenium, zirconium, molybdenum, another conductive material, or any combination of the foregoing.

In various embodiments, the plurality of bonding structures 208 overlies the redistribution wires 310 and are configured to electrically couple the interconnect structure 110 to another integrated chip (not shown). The plurality of bonding structures 208 each comprise an upper conductive structure 121, a bond bump structure 204 overlying the upper conductive structure 121, and a solder ball 206 overlying the bond bump structure 204. In various embodiments, the upper conductive structure 121 comprises a multilayer stack that includes a first conductive layer 120, a dielectric layer 122, and a second conductive layer 124. In various embodiments, although the upper conductive structures 121 of FIG. 3 are illustrated as the upper conductive structure 121 of FIG. 2A, it will be appreciated that the upper conductive structures 121 of FIG. 3 may each be configured as the upper conductive structure 121 of FIG. 2B, 2C, 2D, or 2E.

Figure 4A:
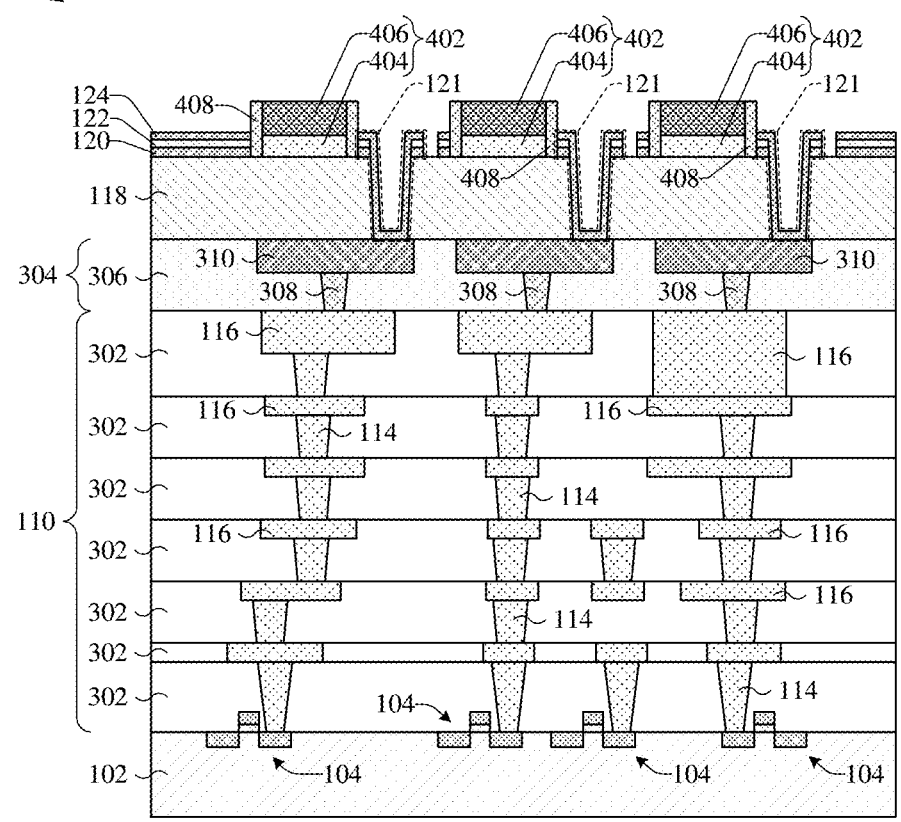
FIGS. 4A-4B illustrate cross-sectional views of some embodiments of an integrated chip having a light-emitting structure vertically above a corresponding upper conductive structure.

FIG. 4A illustrates a cross-sectional view of some embodiments of an integrated chip 400a having a light-emitting structure 406 vertically above a corresponding upper conductive structure 121.

In some embodiments, the integrated chip 400a comprises a plurality of light-emitting devices 402 overlying the passivation structure 118. A dielectric spacer 408 laterally surrounds sidewalls of each light-emitting device 402. In various embodiments, the plurality of light-emitting devices 402 respectively comprise a light-emitting structure 406 overlying an electrode 404. Each light-emitting device 402 is laterally adjacent to and is vertically above a corresponding upper conductive structure 121. In some embodiments, each upper conductive structure 121 is configured to electrically couple a corresponding light-emitting device 402 to the plurality of semiconductor devices 104.

In yet further embodiments, each light-emitting structure 406 directly overlies a corresponding redistribution wire 310 within the redistribution structure 304. In some embodiments, each redistribution structure 304 may be configured as a reflector, and each light-emitting structure 406 may be configured as a light emitting diode (LED), an organic light emitting diode (OLED), or some other suitable light-emitting device. The redistribution wires 310 are electrically coupled to control circuitry (e.g., the semiconductor devices 104), and the control circuitry is configured to selectively apply electrical signals (e.g., voltages) to the redistribution wires 310, such that the light-emitting structures 406 produce light (e.g., visible light). In some embodiments, the light-emitting structures 406 produce light due to the electrical signals causing electron-hole recombination between the electrodes 404 and the light-emitting structures 406. Some of the light produced by the light-emitting structures 406 passes through a corresponding electrode 404 towards the passivation structure 118, reflects off a corresponding reflector (e.g., corresponding redistribution wire 310), and is reflected back toward the light-emitting structures 406, respectively. The light reflected back toward the light-emitting structures 406 may combine with other light produced by the light-emitting structures 406, respectively, and due to constructive and/or deconstructive interference, light having a specific wavelength is emitted from each light-emitting device 402.

In various embodiments, the first conductive layer 120 is configured as a metal hard mask layer that prevents damage to the passivation structure 118 during fabrication of the integrated chip 400a. For example, the first conductive layer 120 prevents plasma from one or more etch process(es) from damaging a lattice of the passivation structure 118 and/or prevents the plasma from implanting electrons within the passivation structure 118 that may interfere with the reflection of light between the plurality of light-emitting devices 402 and the underlying reflectors (e.g., the redistribution wires 310). This, in part, enhances a performance of the light-emitting structures 406. In yet further embodiments, the light-emitting structure 406 may be formed and/or disposed within the opening 202 of FIGS. 2A-2E. In such embodiments, the bond bump structure (e.g., 204 of FIG. 2A) and the solder ball (e.g., 206 of FIG. 2A) may be omitted, and the topmost conductive wire (e.g., 116a of FIG. 2A) may be configured as a reflector.

Figure 4B:
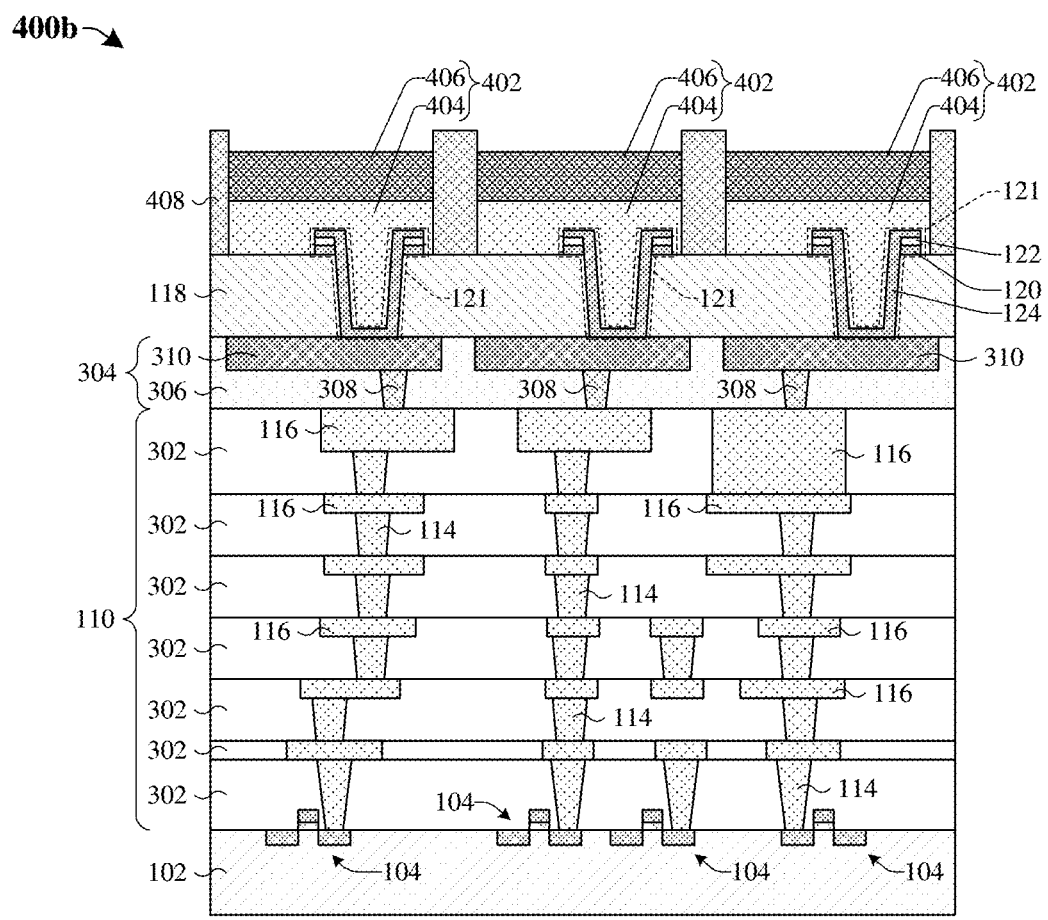

FIG. 4B illustrates a cross-sectional view 400b corresponding to some embodiments of FIG. 4A, in which each light-emitting device 402 directly overlies a corresponding upper conductive structure 121.

As illustrated in FIG. 4B, the electrode 404 of each light-emitting device 402 directly contacts a corresponding upper conductive structure 121. In various embodiments, the electrode 404 directly contacts inner sidewalls and outer sidewalls of the second conductive layer 124 of the upper conductive structure 121, directly contacts outer sidewalls of the dielectric layer 122 of the upper conductive structure 121, and directly contacts outer sidewalls of the first conductive layer 120 of the upper conductive structure 121. In yet further embodiments, the dielectric spacer 408 is configured as a dielectric grid structure that is disposed laterally between each light-emitting device 402. In further embodiments, the light-emitting structure 406 may be formed directly over the upper conductive structure 121 of FIGS. 2A-2E. In such embodiments, the bond bump structure (e.g., 204 of FIG. 2A) and the solder ball (e.g., 206 of FIG. 2A) may be omitted, and the topmost conductive wire (e.g., 116a of FIG. 2A) may be configured as a reflector.

In various embodiments, although the upper conductive structures 121 of FIGS. 4A and 4B are illustrated as the upper conductive structure 121 of FIG. 2A, it will be appreciated that the upper conductive structures 121 of FIGS. 4A and 4B may each be configured as the upper conductive structure 121 of FIG. 2B, 2C, 2D, or 2E.

FIGS. 5-13 illustrate cross-sectional views 500 of 1300 of some embodiments of a method of forming an integrated chip having an upper conductive structure overlying an interconnect structure according to aspects of the present disclosure. Although the cross-sectional views 500-1300 shown in FIGS. 5-13 are described with reference to a method, it will be appreciated that the structures shown in FIGS. 5-13 are not limited to the method but rather may stand alone separate of the method. Furthermore, although FIGS. 5-13 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
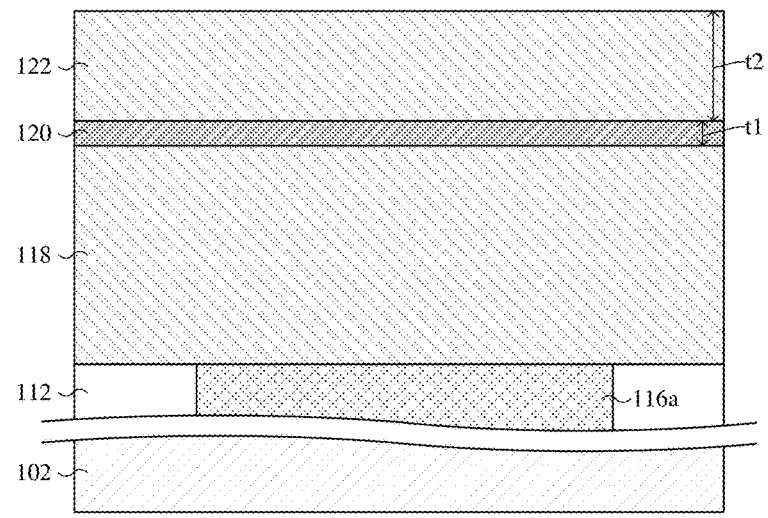
FIGS. 5-13 illustrate cross-sectional views of some embodiments of a method for forming an integrated chip having an upper conductive structure overlying an interconnect structure.

As shown in cross-sectional view 500 of FIG. 5, an interconnect dielectric structure 112 is formed over a semiconductor substrate 102 and a topmost conductive wire 116a is formed within the interconnect dielectric structure 112. In various embodiments, the topmost conductive wire 116a may be part of a topmost conductive layer in an interconnect structure (e.g., as illustrated and/or described in FIG. 1) or may be part of a topmost conductive layer in a redistribution structure (e.g., configured as a redistribution wire as illustrated and/or described in FIG. 3 or 4A-4B). Further, a passivation structure 118 is formed over the topmost conductive wire 116a, a first conductive layer 120 is formed over the passivation structure 118, and a dielectric layer 122 is formed over the first conductive layer 120. In various embodiments, the passivation structure 118 and the dielectric layer 122 may be formed by, for example, a chemical vapor deposition (CVD) process, a physical vapor deposition (PVD) process, an atomic layer deposition (ALD) process, thermal oxidation, another suitable deposition or growth process, or any combination of the foregoing. Further, the first conductive layer 120 may be formed by, for example, a CVD process, a PVD process, a sputtering process, electro plating, electroless plating, another suitable growth or deposition process, or any combination of the foregoing.

In some embodiments, the topmost conductive wire 116a may be or comprise a first conductive material, such as, for example, aluminum, titanium, tantalum, ruthenium, zirconium, molybdenum, another conductive material, or any combination of the foregoing. The passivation structure 118 may, for example, be or comprise silicon dioxide, silicon glass, un-doped silicon glass, another dielectric material, or any combination of the foregoing. In further embodiments, the first conductive layer 120 may be or comprise a second conductive material, such as, for example titanium nitride, aluminum, copper, tantalum nitride, another suitable conductive material, or any combination of the foregoing. The first conductive layer 120 is formed with a first thickness t1 that is within a range of about 50 Angstroms to about 100 Angstroms, or another suitable value. In various embodiments, the first conductive material of the topmost conductive wire 116a is different from the second conductive material of the first conductive layer 120. By virtue of the first conductive layer 120 comprising the first conductive material with the first thickness t1, the first conductive layer 120 may protect the passivation structure 118 during subsequent processing steps (e.g., during the patterning process of FIG. 6 and/or the cleaning process of FIG. 7). Further, the first conductive layer 120 may be configured has a hard mask layer (e.g., a metal hard mask layer) during the subsequent processing steps. The dielectric layer 122 is formed with a second thickness t2 that is within a range of about 100 Angstroms to about 500 Angstroms, or another suitable value. The dielectric layer 122 may, for example, be or comprise silicon dioxide, silicon nitride, aluminum oxide, silicon oxynitride, another suitable dielectric material, or any combination of the foregoing. The dielectric layer 122 may be referred to as a dielectric masking layer.

Figure 6:
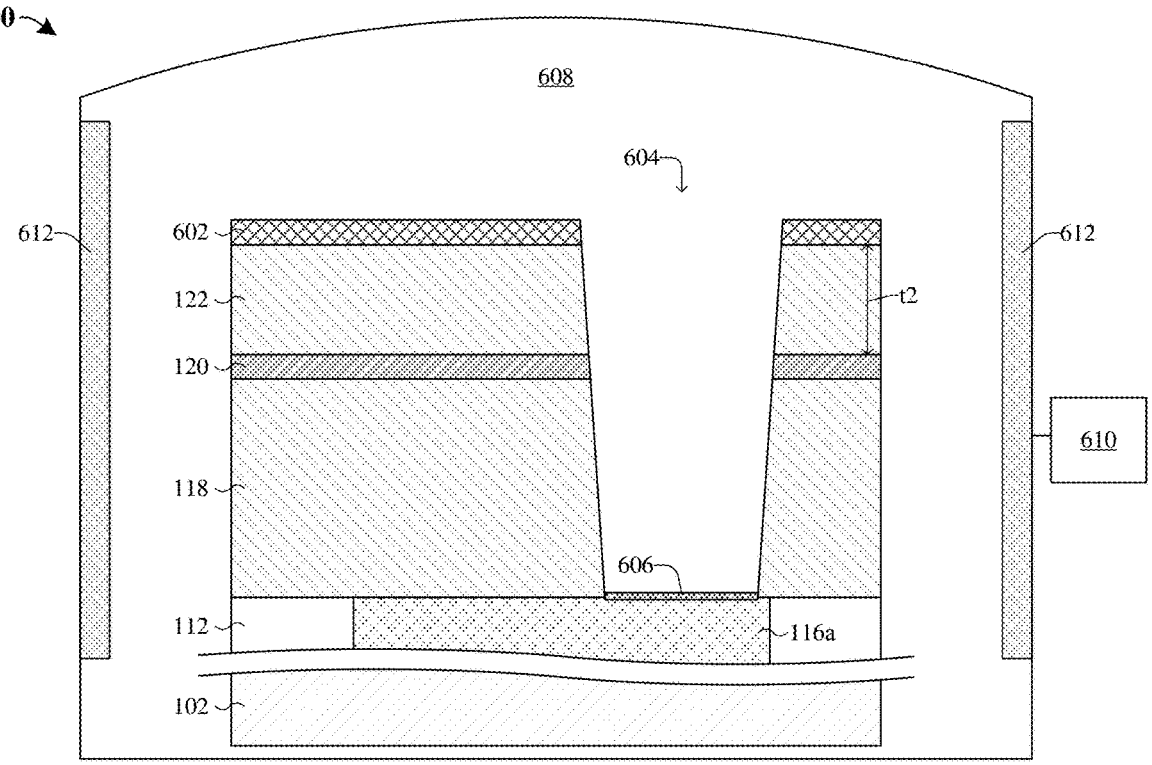

As shown in cross-sectional view 600 of FIG. 6, a photoresist mask 602 is formed over the dielectric layer 122. Further, a first patterning process is performed on the dielectric layer 122, the first conductive layer 120, and the passivation structure 118 according to the photoresist mask 602 to form an opening 604 above the topmost conductive wire 116a. In various embodiments, the first patterning process may stop on the topmost conductive wire 116a and/or may expose a top surface of the topmost conductive wire 116a. In yet further embodiments, the first patterning process may form a metal oxide 606 along the top surface of the topmost conductive wire 116a. Further, the first patterning process may form a trench within the passivation structure 118 that is defined by opposing sidewalls of the passivation structure 118.

In some embodiments, the first patterning process is performed by anisotropic and/or dry etching and may be carried out in a processing chamber 608. In some embodiments, the first patterning process includes: loading the semiconductor substrate 102 into the processing chamber 608, where a radio frequency (RF) power generator 610 is coupled to an RF antenna 612 that may be disposed along and/or within sidewalls of the processing chamber 608 (where the semiconductor substrate 102 is spaced laterally between sidewalls of the processing chamber 608); flowing a first processing gas into the processing chamber 608; applying a RF signal (e.g., having an electric potential) to the RF antenna 612 by way of the RF power generator 610 to form and/or generate a first plasma from the first processing gas inside the processing chamber 608; and bombarding the dielectric layer 122, the first conductive layer 120, and the passivation structure 118 with the first plasma to define the opening 604. In various embodiments, the first plasma and/or oxygen atoms within the processing chamber 608 react with the topmost conductive wire 116a to form the metal oxide 606 along the top surface of the topmost conductive wire 116a. In various embodiments, the metal oxide 606 may, for example, be or aluminum oxide, titanium oxide, tantalum oxide, ruthenium oxide, zirconium oxide, molybdenum oxide, an oxide of the first conductive material of the topmost conductive wire 116a, or the like. In various embodiments, the first processing gas may, for example, be or comprise argon, helium, hydrogen, some other suitable gas, or any combination of the foregoing. In various embodiments, the metal oxide 606 has a relatively high lattice energy (e.g., greater than about 5,000 kJ/mol) that may not readily react with a reducing agent (e.g., hydrogen) during a chemical reduction process (i.e., the relatively high lattice energy may mitigate removal of the metal oxide 606 from a dry etching process that exposes the metal oxide 606 to hydrogen-based plasma).

Figure 7:
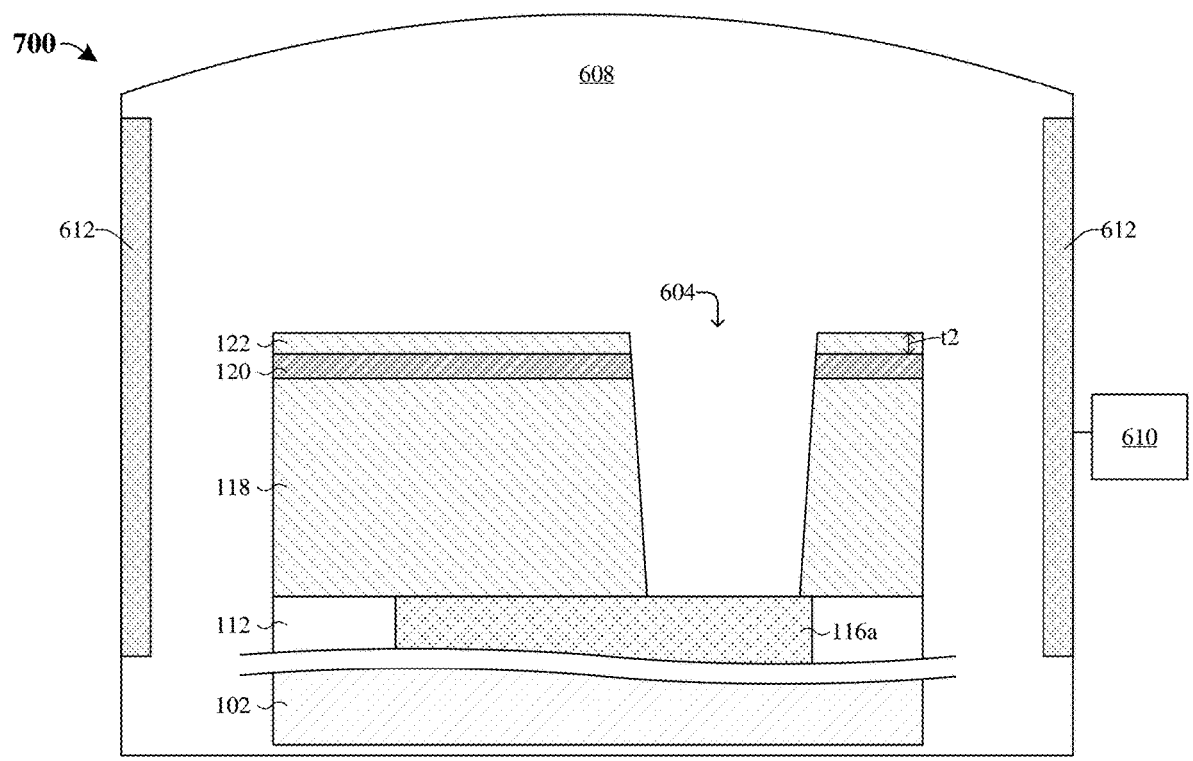

As shown in cross-sectional view 700 of FIG. 7, a cleaning process (e.g., a plasma etching process) is performed on the structure of FIG. 6. In some embodiments, the cleaning process reduces the second thickness t2 of the dielectric layer 122 and/or removes the metal oxide (606 of FIG. 6) from along the top surface of the topmost conductive wire 116a.

In some embodiments, the cleaning process is performed by anisotropic and/or dry etching and may be carried out in the processing chamber 608. In some embodiments, the cleaning process includes: loading the semiconductor substrate 102 into the processing chamber 608; flowing a second processing gas into the processing chamber 608;

applying a RF signal (e.g., having an electric potential) to the RF antenna 612 by way of the RF power generator 610 to form and/or generate a second plasma from the second processing gas inside the processing chamber 608; and bombarding the dielectric layer 122 and the metal oxide (606 of FIG. 6) with the second plasma to remove the metal oxide (606 of FIG. 6). In various embodiments, the second processing gas may, for example, be or comprise argon, helium, some other suitable gas, or any combination of the foregoing. Further, the cleaning process is performed at a sufficiently high power (e.g., within a range of about 250 watts to about 1250 watts) to overcome the high lattice energy of the metal oxide (606 of FIG. 6), thereby ensuring removal of the metal oxide (606 of FIG. 6). By virtue of the thickness and layout of the dielectric layer 122 the second plasma is mitigated from reaching and/or bombarding the first conductive layer 120, thereby mitigating or preventing the re-deposition of conductive material from the first conductive layer 120 onto one or more surfaces of the processing chamber 608. Further, by mitigating re-deposition of conductive materials from the first conductive layer 120 during the cleaning process, the RF antenna 612 may not be impeded from generating sufficient electromagnetic waves that react with processing gas in the processing chamber 608 to form or generate plasma. Thus, an etching rate of the cleaning process may be enhanced to facilitate removal of a majority and/or all of the metal oxide (606 of FIG. 6) from along the top surface of the topmost conductive wire 116*a*. Further a number of WAC process(es) performed on the processing chamber 608 is mitigated and adverse effects to subsequent processing steps performed within the processing chamber 608 are mitigated. In further embodiments, the cleaning process includes an inductively-coupled plasma (ICP) reactive-ion etching (RIE) process that includes flowing a second processing gas into the processing chamber 608.

Figure 8:
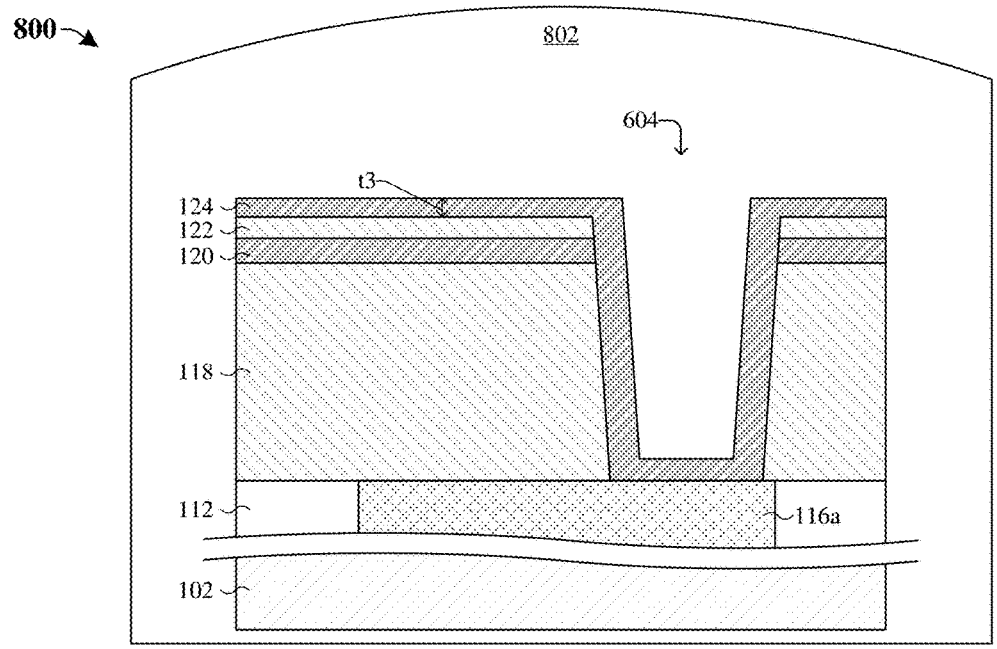

As shown in cross-sectional view 800 of FIG. 8, a second conductive layer 124 is formed over the dielectric layer 122 and the topmost conductive wire 116*a*. The second conductive layer 124 extends along a top surface of the dielectric layer 122 and lines the opening 604. In various embodiments, the second conductive layer 124 may be formed within a deposition processing chamber 802 by, for example, a CVD process, a PVD process, a sputtering process, electro plating, electroless plating, another suitable growth or deposition process, or any combination of the foregoing. Further, the second conductive layer 124 may be or comprise the second conductive material (e.g., titanium nitride, aluminum copper, tantalum nitride, another suitable conductive material, or any combination of the foregoing). In some embodiments, the second conductive layer 124 is formed with a third thickness t3 that is within a range of about 150 Angstroms to about 500 Angstroms, or another suitable value. By virtue of the metal oxide (606 of FIG. 6) being removed by the cleaning process of FIG. 7, the second conductive layer 124 may make a good electrical contact (e.g., an Ohmic contact) with the topmost conductive wire 116*a*. This, in part, may reduce an RC delay and decreases device yield loss.

Figure 9:
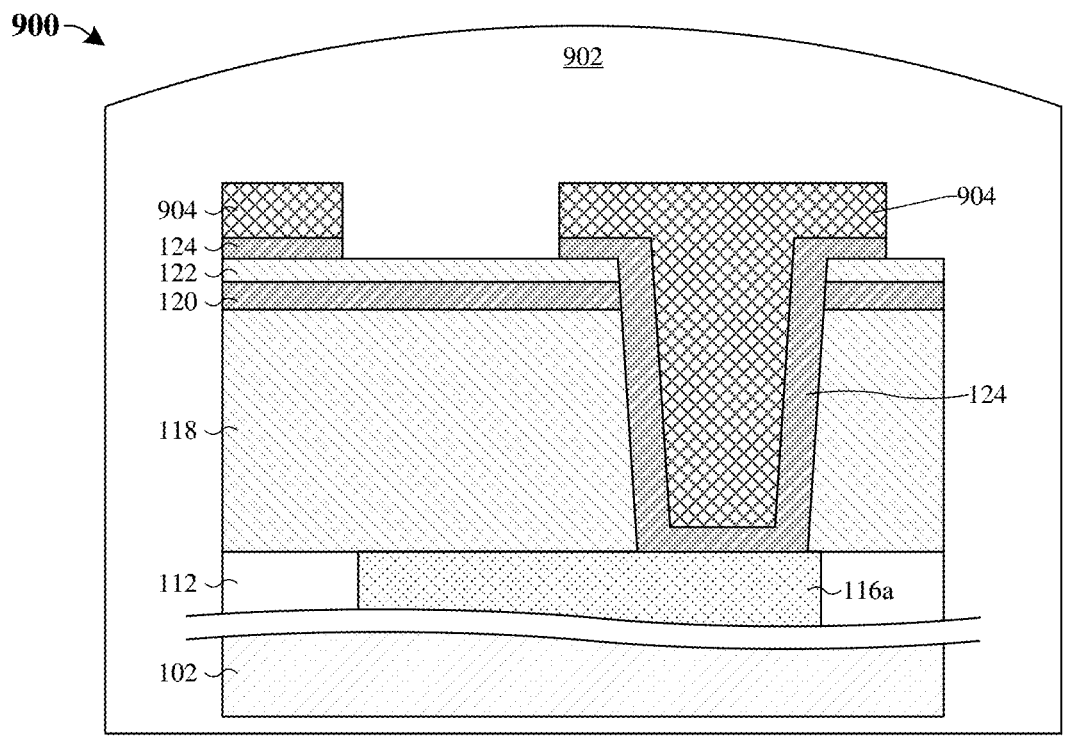

As shown in cross-sectional view 900 of FIG. 9, a photoresist masking layer 904 is formed over the second conductive layer 124 and fills the opening (604 of FIG. 8). Subsequently, a first etching process is performed on the second conductive layer 124, thereby removing unmasked segments of the second conductive layer 124. In various embodiments, the first etching process defines a conductive via segment in the second conductive layer 124 that directly overlies the topmost conductive wire 116*a*. In further embodiments, the first etching process is performed within a first etch processing chamber 902 and includes performing a first wet etch that exposes the second conductive layer 124 to one or more first wet etchants (e.g., hydrogen peroxide). The photoresist masking layer 904 may, for example, be or comprise a polymer or another suitable material.

Figure 10:
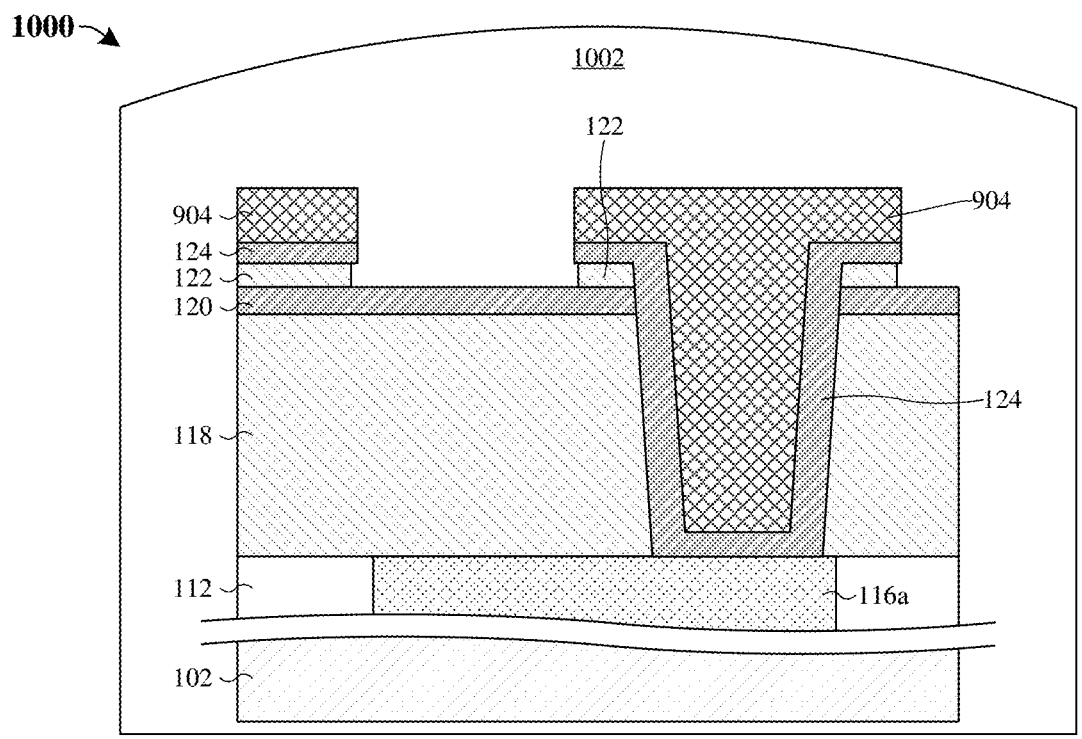

As shown in cross-sectional view 1000 of FIG. 10, a second etching process is performed on the dielectric layer 122, thereby removing unmasked segments of the dielectric layer 122. In various embodiments, the second etching process is performed within a second etch processing chamber 1002 and includes performing a second wet etch that exposes the dielectric layer 122 to one or more second wet etchants (e.g., hydrofluoric acid, diluted hydrofluoric acid, etc.).

Figure 11:
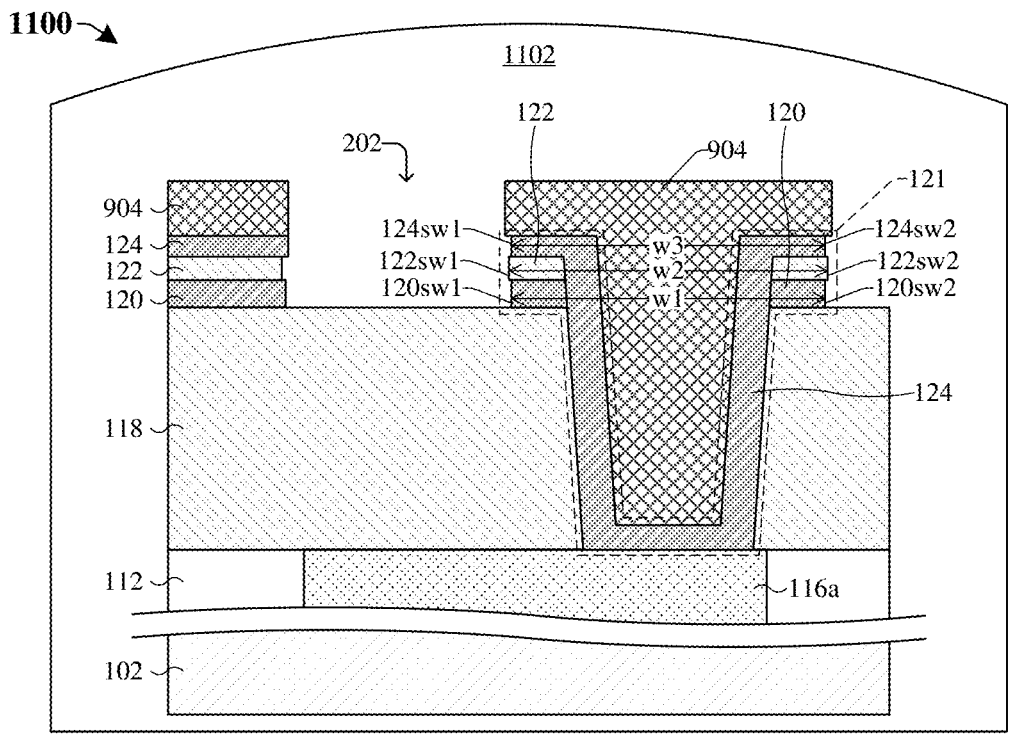

As shown in cross-sectional view 1100 of FIG. 11, a third etching process is performed on the first conductive layer 120, thereby defining an upper conductive structure 121 and an opening 202 laterally adjacent to the upper conductive structure 121 that exposes an upper surface of the passivation structure 118. In some embodiments, the third etching process removes unmasked segments of the first conductive layer 120. In further embodiments, the third etching process is performed within a third etch processing chamber 1102 and includes performing a third etch that exposes the first conductive layer 120 to one or more first wet etchants (e.g., hydrogen peroxide). The upper conductive structure 121 includes the first conductive layer 120, the dielectric layer 122, and the second conductive layer 124. In yet further embodiments, a process for forming the upper conductive structure 121 includes the processing steps illustrated and/or described in FIGS. 6-11.

The first, second, and third etching processes of FIGS. 9-11 are performed such that the first conductive layer 120 of the upper conductive structure 121 has a first width w1 defined between opposing sidewalls 120*sw*1, 120*sw*2 of the first conductive layer 120; the dielectric layer 122 of the upper conductive structure 121 has a second width w2 defined between opposing sidewalls 122*sw*1, 122*sw*2 of the dielectric layer 122; and the second conductive layer 124 of the upper conductive structure 121 has a third width w3 defined between opposing sidewalls 124*sw*1, 124*sw*2 of the second conductive layer 124. In various embodiments, the first width w1 is less than the second width w2, the second width w2 is greater than the third width w3, and the third width w3 is greater than the first width w1 (e.g., as illustrated and/or described in FIG. 2B). In various embodiments, this may occur because the first etching process of FIG. 9 leaves the second conductive layer 124 of the upper conductive structure 121 with an initial width, then the second and/or third etching process(es) further reduce(s) the width of the second conductive layer 124. In yet further embodiments, by virtue of the first, second, and third etching processes of FIGS. 9-11 each including a wet etch process, the opposing sidewalls of the first conductive layer 120, the dielectric layer 122, and the second conductive layer 124 of the upper conductive structure 121 may be beveled and/or recessed such that the opposing sidewalls are each curved, concave, and/or recessed as illustrated and/or described in FIG. 2D.

In various embodiments, the processing chamber 608, the deposition processing chamber 802, the first etch processing chamber 902, the second etch processing chamber 1002, and the third etch processing chamber 1102 are the same. As such, the semiconductor substrate 102 is in the same processing chamber from a beginning of the first patterning process of FIG. 6 to an end of the third etching process of FIG. 11. Thus, the processing steps of FIGS. 6-11 are performed in situ. This may, for example, be employed to prevent moisture from entering the same processing chamber and/or oxidation of conductive layers and/or structures over the semiconductor substrate 102. Further, by performing the processing steps of FIGS. 6-11 in situ, a time and/or cost associated with moving the semiconductor substrate 102 between different processing chambers may be reduced.

Figure 12:
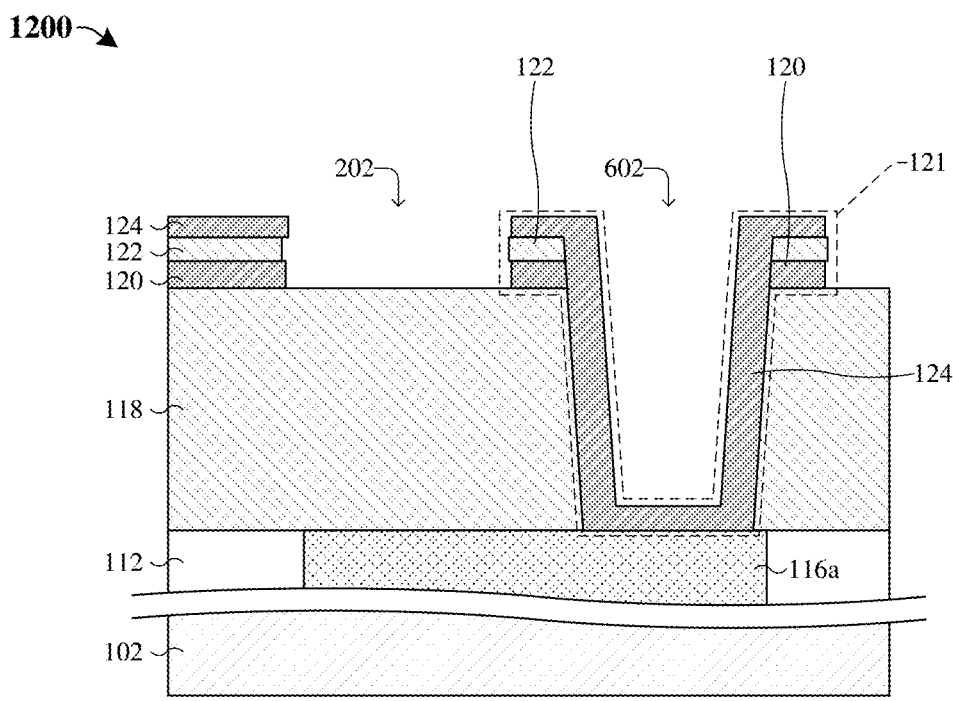

As shown in cross-sectional view 1200 of FIG. 12, a removal process is performed to remove the photoresist masking layer (904 of FIG. 11) from over the second conductive layer 124. In various embodiments, the removal process includes performing a wet etch process, a dry etch process, or another suitable removal process.

Figure 13:
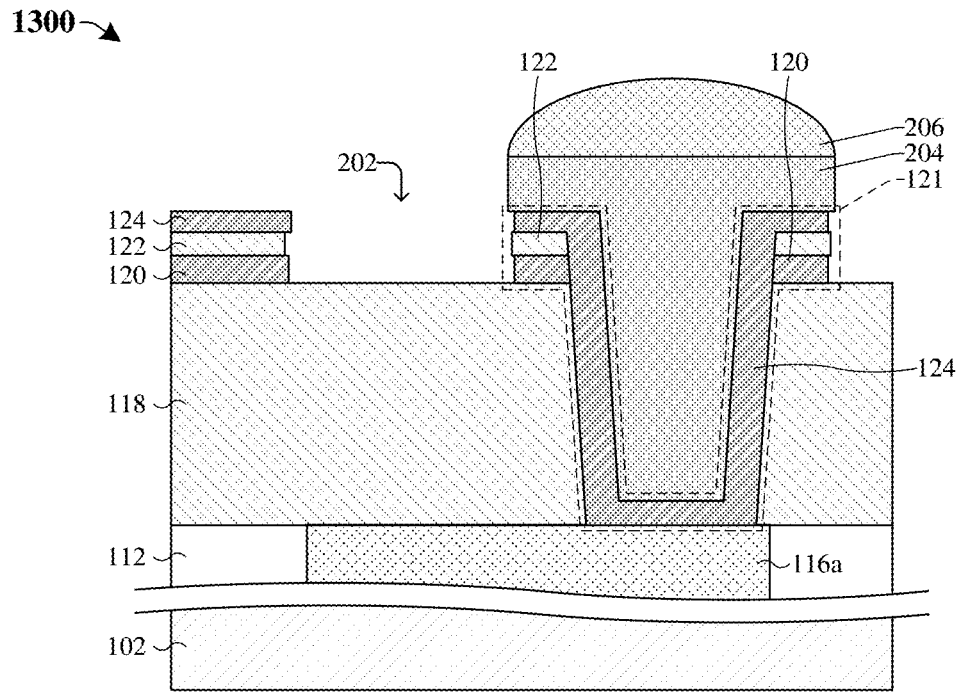

As shown in cross-sectional view 1300 of FIG. 13, a bond bump structure 204 is formed over the second conductive layer 124 of the upper conductive structure 121. Further, a solder ball 206 is formed over the bond bump structure 204.

Figure 14:
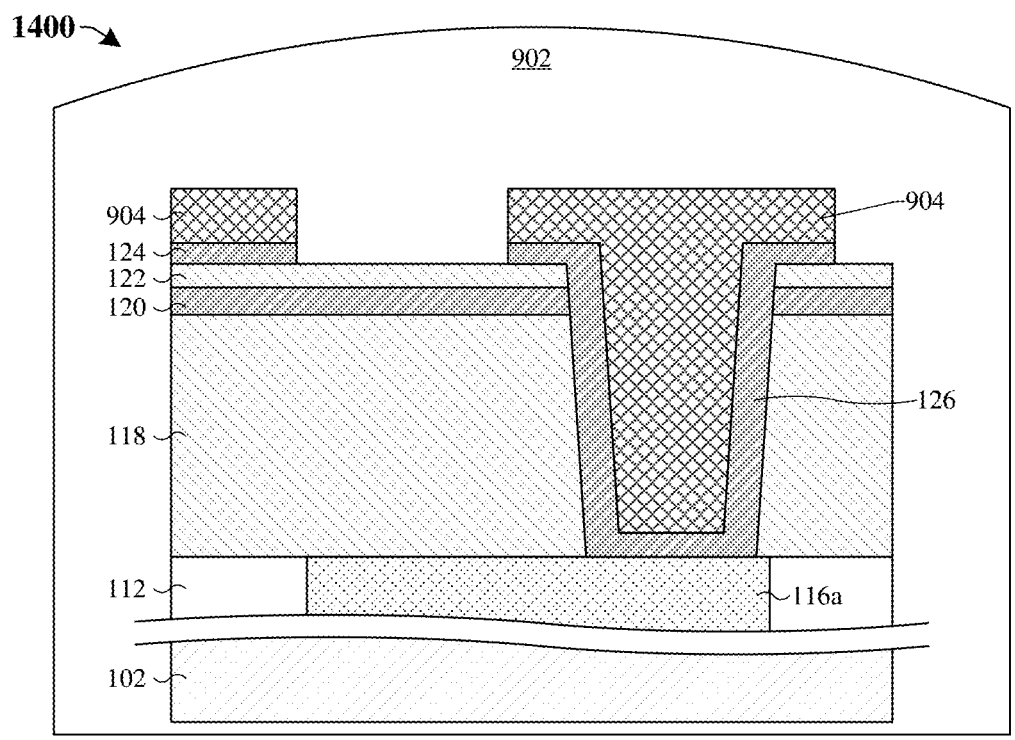
FIGS. 14-16 illustrate cross-sectional views of some embodiments of a method for forming an integrated chip having an upper conductive structure overlying an interconnect structure.
Figure 15:
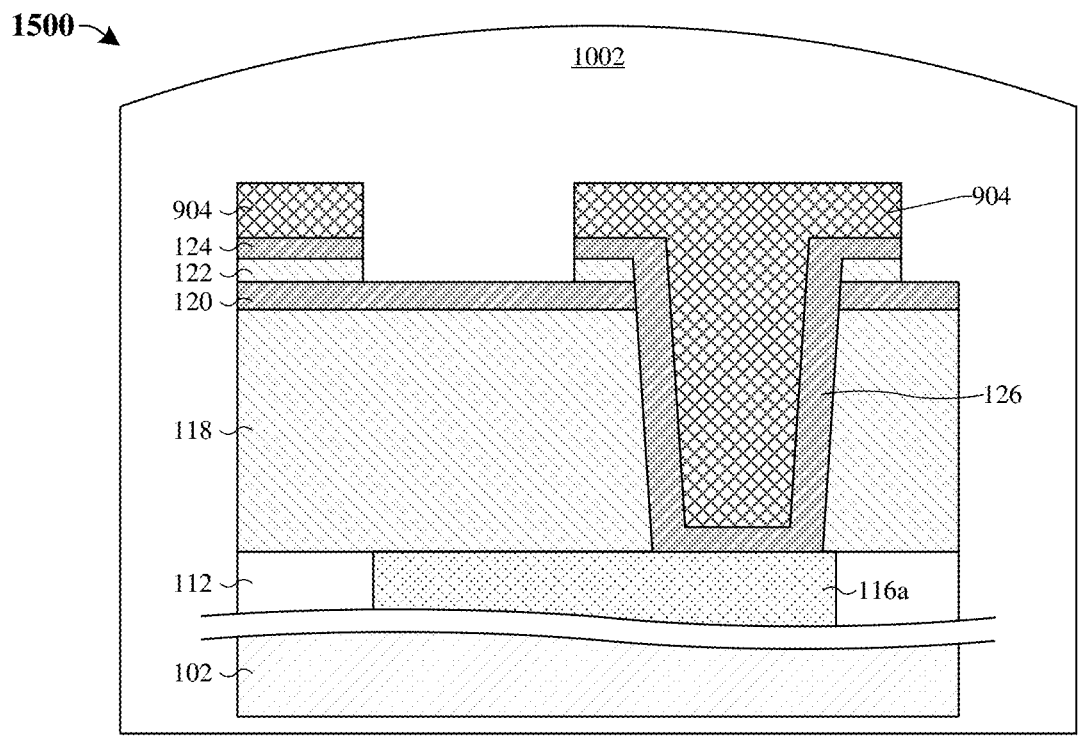
Figure 16:
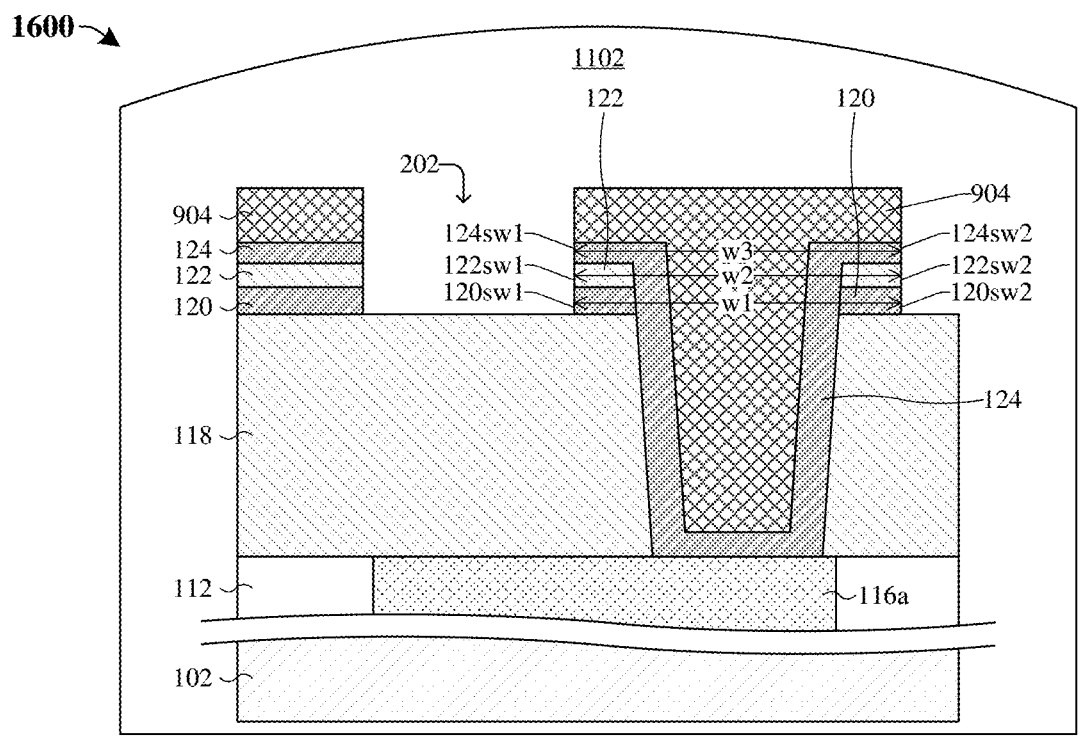

FIGS. 14-16 illustrate cross-sectional views 1400-1600 of some embodiments of acts that may be performed in place of the acts at FIGS. 9-11, such that the method of FIGS. 5-13 may alternatively proceed from FIGS. 5-8 to FIGS. 14-16, and then from FIG. 16 to FIGS. 12-13 (i.e., skipping FIGS. 9-11).

As shown in cross-sectional view 1400 of FIG. 14, a photoresist masking layer 904 is formed over the second conductive layer 124. Subsequently, a first etching process is performed on the second conductive layer 124, thereby removing unmasked segments of the second conductive layer 124. In further embodiments, the first etching process is performed within a first etch processing chamber 902 and includes performing a first dry etch process (e.g., a first ICP RIE process) that exposes the second conductive layer 124 to one or more first dry etchants (e.g., chlorine-based etchants).

As shown in cross-sectional view 1500 of FIG. 15, a second etching process is performed on the dielectric layer 122, thereby removing unmasked segments of the dielectric layer 122. In various embodiments, the second etching process is performed within a second etch processing chamber 1002 and includes performing a second dry etch process (e.g., a second ICP RIE process) that exposes the dielectric layer 122 to one or more second dry etchants (e.g., fluorine-based etchants).

As shown in cross-sectional view 1600 of FIG. 16, a third etching process is performed on the first conductive layer 120, thereby defining an upper conductive structure 121 and an opening 202 laterally adjacent to the upper conductive structure 121 that exposes an upper surface of the passivation structure 118. In some embodiments, the third etching process removes unmasked segments of the first conductive layer 120. In further embodiments, the third etching process is performed within a third etch processing chamber 1102 an includes performing a third dry etch process (e.g., a third ICP RIE process) that exposes the first conductive layer 120 to one or more first dry etchants (e.g., chlorine-based etchants). In yet further embodiments, a process for forming the upper conductive structure 121 includes the processing steps illustrated and/or described in FIGS. 6-8 and 14-16.

In some embodiments, the first, second, and third etching processes of FIGS. 14-16 are performed such that the first width w1 of the first conductive layer 120, the second width w2 of the dielectric layer 122, and the third width w3 of the second conductive layer 124 are equal to one another. In yet further embodiments, the first, second, and third etching processes of FIGS. 14-16 are performed such that opposing sidewalls 120sw1, 120sw2 of the first conductive layer 120, opposing sidewalls 122sw1, 122sw2 of the dielectric layer 122, and opposing sidewalls 124sw1, 124sw2 of the second conductive layer 124 are substantially straight (e.g., perpendicular relative to the top surface of the passivation structure 118) and aligned with one another as illustrated and/or described in FIG. 2A.

Figure 17:
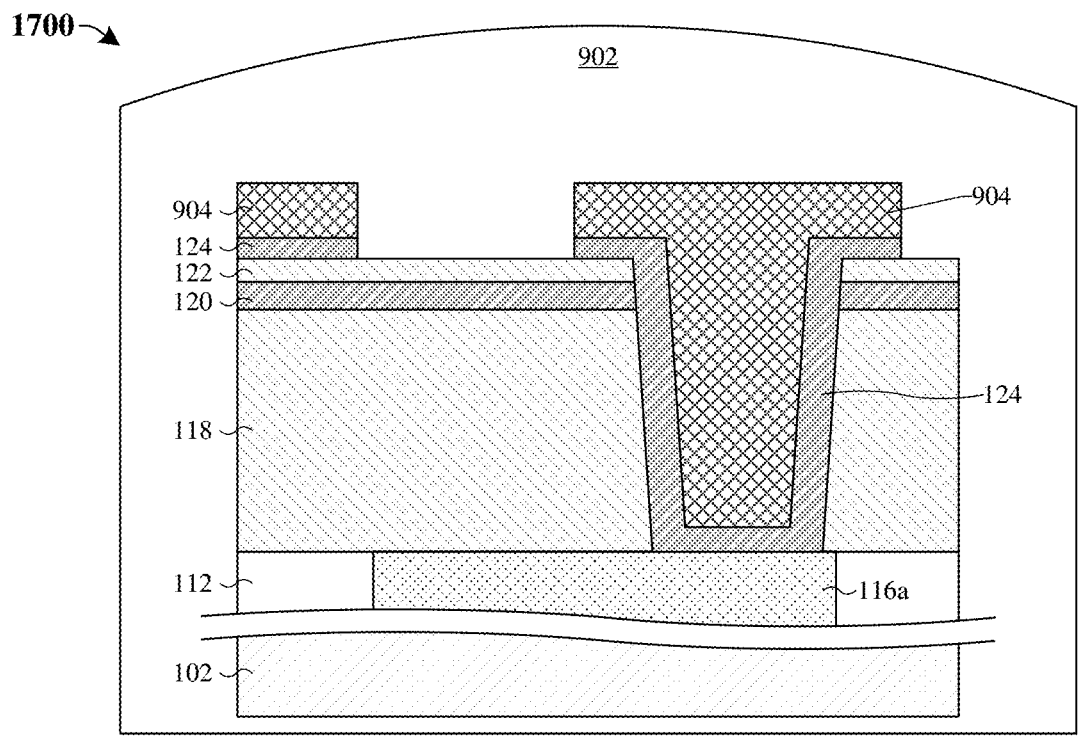
FIGS. 17-19 illustrate cross-sectional views of yet other embodiments of a method for forming an integrated chip having an upper conductive structure overlying an interconnect structure.
Figure 18:
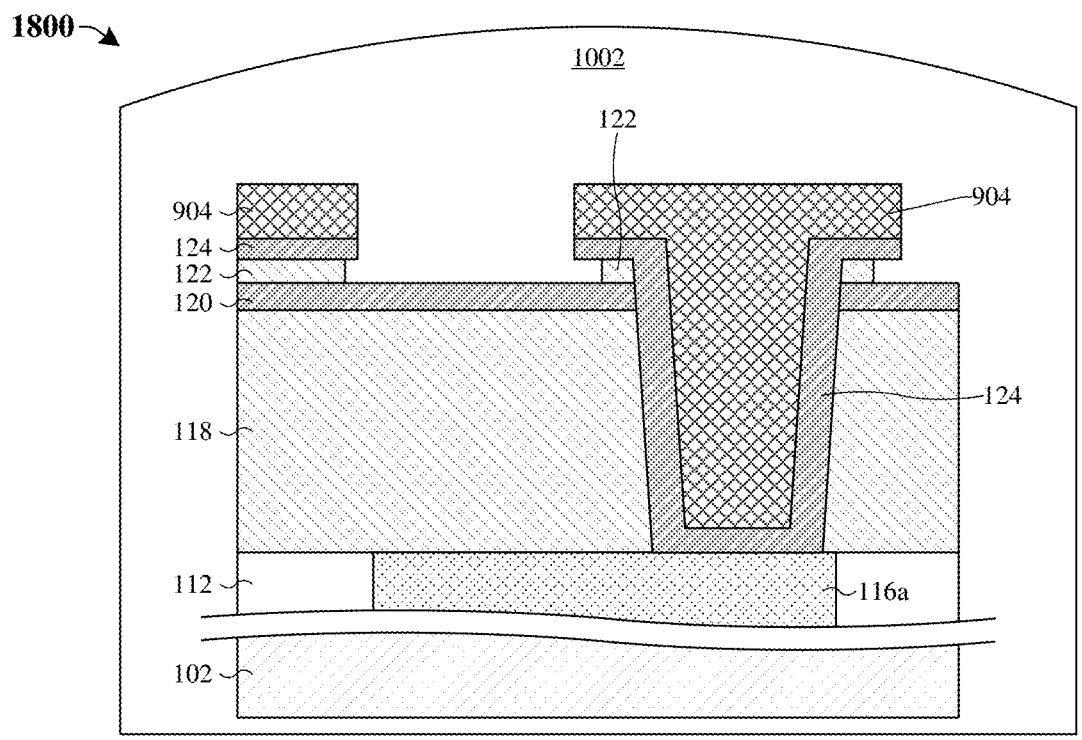
Figure 19:
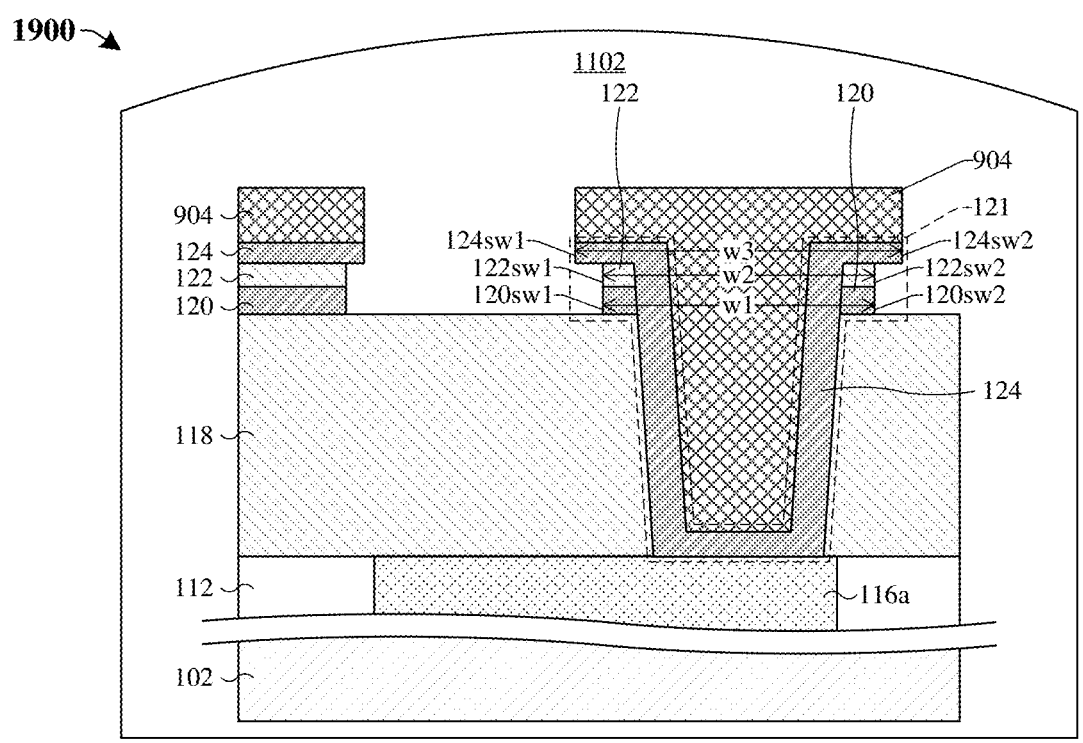

FIGS. 17-19 illustrate cross-sectional views 1700-1900 of some embodiments of acts that may be performed in place of the acts at FIGS. 9-11, such that the method of FIGS. 5-13 may alternatively proceed from FIGS. 5-8 to FIGS. 17-19, and then from FIG. 19 to FIGS. 12-13 (i.e., skipping FIGS. 9-11).

As shown in cross-sectional view 1700 of FIG. 17, a photoresist masking layer 904 is formed over the second conductive layer 124. Subsequently, a first etching process is performed on the second conductive layer 124, thereby removing unmasked segments of the second conductive layer 124. In some embodiments, the first etching process is performed within a first etch processing chamber 902 and includes performing a first wet etch that exposes the second conductive layer 124 to one or more first wet etchants (e.g., hydrogen peroxide).

As shown in cross-sectional view 1800 of FIG. 18, a second etching process is performed on the dielectric layer 122, thereby removing unmasked segments of the dielectric layer 122. In various embodiments, the second etching process is performed within a second etch processing chamber 1002 and includes performing a second wet etch that exposes the dielectric layer 122 to one or more second wet etchants (e.g., hydrofluoric acid, diluted hydrofluoric acid, etc.).

As shown in cross-sectional view 1900 of FIG. 19, a third etching process is performed on the first conductive layer 120, thereby defining an upper conductive structure 121 and an opening 202 laterally adjacent to the upper conductive structure 121 that exposes an upper surface of the passivation structure 118. In some embodiments, the third etching process removes unmasked segments of the first conductive layer 120. In further embodiments, the third etching process is performed within a third etch processing chamber 1102 and includes performing a first dry etch process (e.g., an ICP RIE process) that exposes the first conductive layer 120 to one or more first dry etchants (e.g., chlorine-based etchants). In yet further embodiments, a process for forming the upper conductive structure 121 includes the processing steps illustrated and/or described in FIGS. 6-8 and 17-19.

In some embodiments, the first, second, and third etching processes of FIGS. 17-19 are performed such that the first width w1 of the first conductive layer 120 and the second width w2 of the dielectric layer 122 are equal, and the third width w3 of the second conductive layer 124 is greater than the first width w1 and the second width w2 (e.g., as illustrated and/or described in FIG. 2C). In yet further embodiments, by virtue of the first and second etching processes of FIGS. 17 and 18 each including a wet etch process, opposing sidewalls 124sw1, 124sw2 of the second conductive layer 124 and opposing sidewalls 122sw1, 122sw2 of the dielectric layer 122 may be beveled and/or recessed such that the opposing sidewalls are each curved, concave, and/or recessed as illustrated and/or described in FIG. 2E. In some embodiments, by virtue of the third etching process of FIG. 19 including a dry etch process, opposing sidewalls 120sw1, 120sw2 of the first conductive layer 120 may be slanted relative to a top surface of the passivation structure 118 as illustrated and/or described in FIG. 2E.

Figure 20:
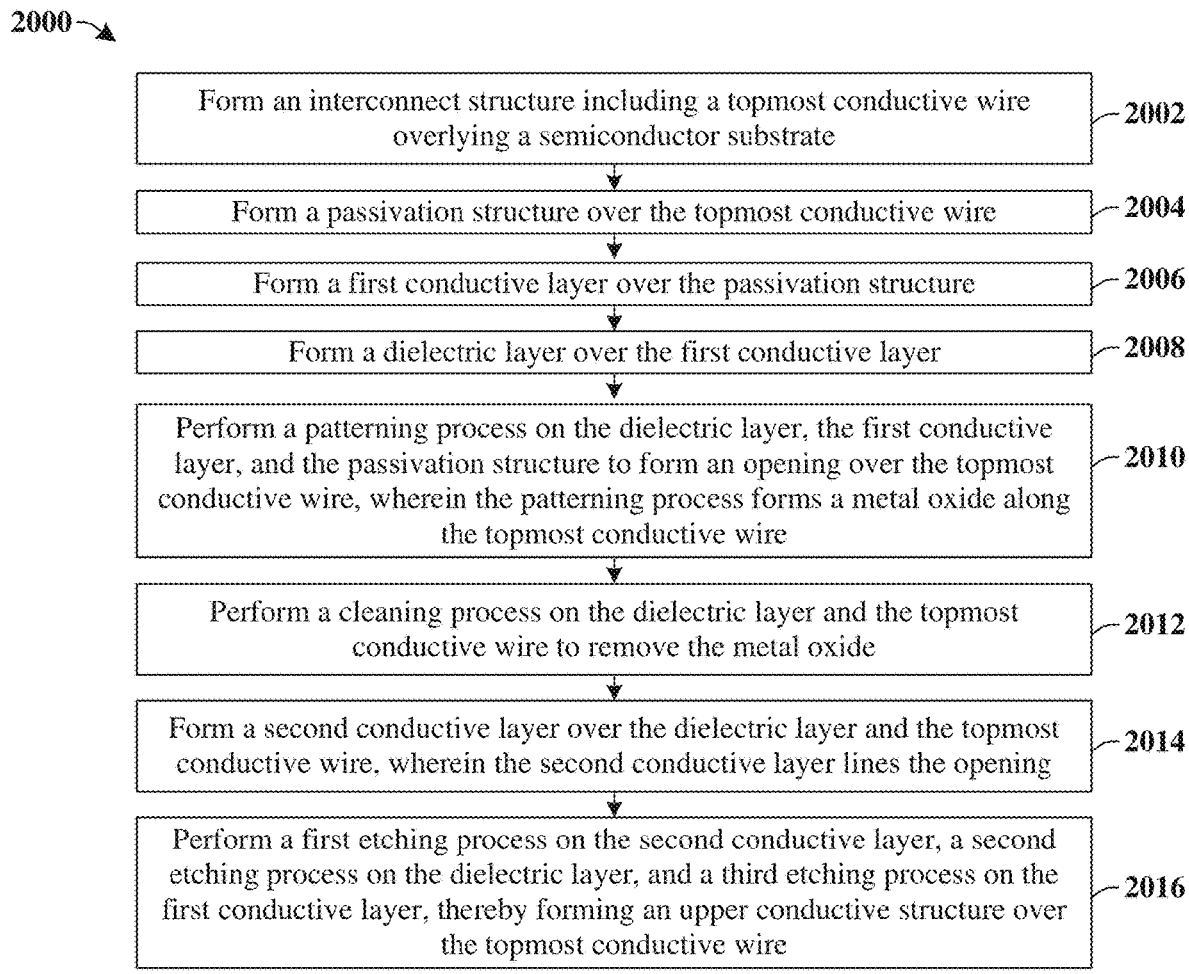
FIG. 20 illustrates a flowchart of some embodiments of a method for forming an integrated chip having an upper conductive structure overlying an interconnect structure.

FIG. 20 illustrates a method 2000 for forming an integrated chip having an upper conductive structure overlying an interconnect structure according to the present disclosure. Although the method 2000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2002, an interconnect structure including a topmost conductive wire is formed over a semiconductor substrate. FIG. 5 illustrates a cross-sectional view 500 corresponding to some embodiments of act 2002.

At act 2004, a passivation structure is formed over the topmost conductive wire. FIG. 5 illustrates a cross-sectional view 500 corresponding to some embodiments of act 2004.

At act 2006, a first conductive layer is formed over the passivation structure. FIG. 5 illustrates a cross-sectional view 500 corresponding to some embodiments of act 2006.

At act 2008, a dielectric layer is formed over the first conductive layer. FIG. 5 illustrates a cross-sectional view 500 corresponding to some embodiments of act 2008.

At act 2010, a patterning process is performed on the dielectric layer, the first conductive layer, and the passivation structure to form an opening over the topmost conductive wire. The patterning process forms a metal oxide along the topmost conductive wire. FIG. 6 illustrates a cross-sectional view 600 corresponding to some embodiments of act 2010.

At act 2012, a cleaning process is performed on the dielectric layer and the topmost conductive wire to remove the metal oxide. FIG. 7 illustrates a cross-sectional view 700 corresponding to some embodiments of act 2012.

At act 2014, a second conductive layer is formed over the dielectric layer and the topmost conductive wire, where the second conductive layer lines the opening. FIG. 8 illustrates a cross-sectional view 800 corresponding to some embodiments of act 2014.

At act 2016, a first etching process is performed on the second conductive layer, a second etching process is performed on the dielectric layer, and a third etching process is performed on the first conductive layer, thereby forming an upper conductive structure over the topmost conductive wire. FIGS. 9-11 illustrate cross-sectional views 900-1100 corresponding to some embodiments of act 2016. FIGS. 14-16 illustrate cross-sectional views 1400-1600 corresponding to some embodiments of act 2016. FIGS. 17-19 illustrate cross-sectional views 1700-1900 corresponding to further embodiments of act 2016.

Accordingly, in some embodiments, the present disclosure relates to an upper conductive structure disposed within a passivation structure and overlying a topmost conductive wire. The upper conductive structure comprises a multilayer stack that includes a first conductive layer disposed along the passivation structure, a dielectric layer overlying the first conductive layer, and a second conductive layer overlying the dielectric layer and extending through the passivation structure to contact the topmost conductive wire.

In some embodiments, the present application provides an integrated chip, including: an interconnect structure overlying a semiconductor substrate and comprising a conductive wire; a passivation structure overlying the interconnect structure; and an upper conductive structure overlying the passivation structure and comprising a first conductive layer, a dielectric layer, and a second conductive layer, wherein the first conductive layer is disposed between the dielectric layer and the passivation structure, wherein the second conductive layer extends along a top surface of the dielectric layer and penetrates through the first conductive layer and the passivation structure to the conductive wire. In an embodiment, the first conductive layer and the second conductive layer comprise a first conductive material. In an embodiment, the conductive wire comprises a second conductive material different from the first conductive material. In an embodiment, a first thickness of the first conductive layer is less than a second thickness of the second conductive layer. In an embodiment, the second conductive layer comprises a center conductive segment and a peripheral conductive segment that extends outwardly from the center conductive segment, wherein the peripheral conductive segment continuously laterally wraps around the center conductive segment and directly contacts the top surface of the dielectric layer. In an embodiment, the center conductive segment directly contacts a top surface of the conductive wire, and wherein the center conductive segment contacts inner sidewalls of the dielectric layer, inner sidewalls of the first conductive layer, and inner sidewalls of the passivation structure. In an embodiment, the conductive wire of the interconnect structure is disposed in a topmost conductive layer of the interconnect structure. In an embodiment, outer sidewalls of the first conductive layer, outer sidewalls of the dielectric layer, and outer sidewalls of the first conductive layer are respectively straight and aligned with one another. In an embodiment, outer sidewalls of the second conductive layer and outer sidewalls of the dielectric layer are curved inward towards a center of the upper conductive structure.

In some embodiments, the present application provides an integrated chip, including: a dielectric structure overlying a semiconductor substrate; a conductive wire disposed within the dielectric structure, wherein a top surface of the conductive wire is aligned with a top surface of the dielectric structure; a passivation structure disposed over the dielectric structure and comprising opposing sidewalls defining a trench over the conductive wire; and an upper conductive structure disposed within the trench and electrically coupled to the conductive wire, wherein the upper conductive structure comprises a first conductive layer, a dielectric layer, and a second conductive layer, wherein the first conductive layer and the dielectric layer are disposed along a top surface of the passivation structure, wherein the second conductive layer lines the trench and directly contacts the top surface of the conductive wire, and wherein a top surface of the second conductive layer is above the dielectric layer. In an embodiment, the first conductive layer and the dielectric layer each laterally wrap around a center segment of the second conductive layer. In an embodiment, the integrated chip further includes: a bond bump structure overlying the second conductive layer and filling the trench, wherein a bottom surface of the bond bump structure is disposed below a bottom surface of the first conductive layer; and a solder ball disposed along a top surface of the bond bump structure. In an embodiment, the integrated chip further includes a light-emitting device overlying the passivation structure, wherein the light-emitting device is laterally adjacent to the upper conductive structure, and wherein the light-emitting device comprises a light-emitting structure over an electrode. In an embodiment, the electrode continuously extends from above the second conductive layer, along inner sidewalls of the second conductive layer, to a point below the top surface of the passivation structure, wherein the light-emitting structure directly overlies the upper conductive structure. In an embodiment, the electrode directly contacts an outer sidewall of the first conductive layer, an outer sidewall of the dielectric layer, and an outer sidewall of the second conductive layer.

In some embodiments, the present application provides a method for forming an integrated chip, the method including: depositing a passivation structure over a conductive wire; depositing a first conductive layer over the passivation structure; depositing a dielectric layer over the first conductive layer; performing a patterning process on the passivation structure, the first conductive layer, and the dielectric layer to form an opening above the conductive wire, wherein the patterning process forms a metal oxide along a top surface of the conductive wire; performing a cleaning process on the dielectric layer and the conductive wire to remove the metal oxide from along the top surface of the conductive wire; depositing a second conductive layer over the dielectric layer and the conductive wire such that the second conductive layer lines the opening and contacts the conductive wire; and etching the second conductive layer, the dielectric layer, and the first conductive layer to form an upper conductive structure over the conductive wire. In an embodiment, etching the second conductive layer, the dielectric layer, and the first conductive layer includes: forming an upper masking layer over the second conductive layer such that the upper masking layer fills a remainder of the opening; performing a first etching process on the second conductive layer; performing a second etching process on the dielectric layer; and performing a third etching process on the first conductive layer. In an embodiment, the first etching process includes exposing the second conductive layer to a first wet etchant, the third etching process includes exposing the first conductive layer to the first wet etchant, and wherein the second etching process includes exposing the dielectric layer to a second wet etchant different from the first wet etchant. In an embodiment, the cleaning process is an inductively-coupled plasma (ICP) reactive-ion etching (RIE) process that exposes the metal oxide to an argon-based plasma. In an embodiment, the metal oxide comprises a material having a lattice energy greater than about 5,000 kJ/mol.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    depositing a passivation structure over a conductive wire;
    depositing a first conductive layer over the passivation structure;
    depositing a dielectric layer over the first conductive layer;
    performing a patterning process on the passivation structure, the first conductive layer, and the dielectric layer to form an opening above the conductive wire, wherein the patterning process forms a metal oxide along a top surface of the conductive wire;
    performing a cleaning process on the dielectric layer and the conductive wire to remove the metal oxide from along the top surface of the conductive wire;
    depositing a second conductive layer over the dielectric layer and the conductive wire such that the second conductive layer lines the opening and contacts the conductive wire; and
    etching the second conductive layer, the dielectric layer, and the first conductive layer to form an upper conductive structure over the conductive wire.

2. The method of claim 1, wherein etching the second conductive layer, the dielectric layer, and the first conductive layer comprises:
    forming an upper masking layer over the second conductive layer such that the upper masking layer fills a remainder of the opening;
    performing a first etching process on the second conductive layer;
    performing a second etching process on the dielectric layer; and
    performing a third etching process on the first conductive layer.

3. The method of claim 2, wherein the first etching process includes exposing the second conductive layer to a first wet etchant, the third etching process includes exposing the first conductive layer to the first wet etchant, and wherein the second etching process includes exposing the dielectric layer to a second wet etchant different from the first wet etchant.

4. The method of claim 2, wherein the cleaning process is an inductively-coupled plasma (ICP) reactive-ion etching (RIE) process that exposes the metal oxide to an argon-based plasma.

5. The method of claim 2, wherein the metal oxide comprises a material having a lattice energy greater than about 5,000 kJ/mol.

6. The method of claim 1, wherein the first conductive layer and the second conductive layer comprise a first conductive material.

7. The method of claim 6, wherein the conductive wire comprises a second conductive material different from the first conductive material.

8. The method of claim 6, wherein the first conductive material is titanium nitride, aluminum, copper, or tantalum nitride, and wherein the dielectric layer comprises silicon dioxide, silicon nitride, aluminum oxide, or silicon oxynitride.

9. A method for forming an integrated chip, the method comprising:
    forming an interconnect structure over a semiconductor substrate, wherein the interconnect structure comprises a conductive wire;
    forming an upper dielectric structure on the interconnect structure;
    depositing a first conductive layer on the upper dielectric structure and a dielectric layer on the first conductive layer; and
    forming a second conductive layer on the dielectric layer, wherein the second conductive layer comprises a middle conductive segment extending through the first conductive layer, the dielectric layer, and the upper dielectric structure to contact the conductive wire, wherein the middle conductive segment comprises a first sidewall that directly contacts an inner sidewall of the first conductive layer and an inner sidewall of the dielectric layer, wherein the inner sidewall of the first conductive layer is aligned with the inner sidewall of the dielectric layer.

10. The method of claim 9, further comprising:
performing an etching process on the first conductive layer, the dielectric layer, and the second conductive layer to form an upper conductive structure over the conductive wire.

11. The method of claim 10, wherein the etching process comprises performing a first etch on the first conductive layer, a second etch on the dielectric layer, and a third etch on the second conductive layer.

12. The method of claim 11, wherein the first etch and the third etch utilize a first etchant, and wherein the second etch utilizes a second etchant different from the first etchant.

13. The method of claim 11, wherein the first etch, the second etch, and the third etch respectively comprise a wet etch.

14. The method of claim 9, wherein outer sidewalls of the second conductive layer, outer sidewalls of the dielectric layer, and outer sidewalls of the first conductive layer are aligned with one another.

15. The method of claim 11, wherein the first etch and the second etch respectively comprise a wet etch, wherein the third etch comprises a dry etch.

16. The method of claim 9, wherein the first sidewall of the middle conductive segment is linear.

17. A method for forming an integrated chip, the method comprising:
depositing an upper dielectric structure over a conductive wire;
depositing a conductive masking layer over the upper dielectric structure;
depositing a dielectric masking layer on the conductive masking layer;
forming an opening in the dielectric masking layer, the conductive masking layer, and the upper dielectric structure;
forming a conductive layer lining the opening, wherein the conductive layer overlies the dielectric masking layer and is electrically coupled to the conductive wire, and wherein the conductive layer directly contacts inner sidewalls of the conductive masking layer and inner sidewalls of the dielectric masking layer; and
performing an etching process on the conductive masking layer, the dielectric masking layer, and the conductive layer to form an upper conductive structure over the conductive wire.

18. The method of claim 17, wherein after the etching process outer sidewalls of the conductive masking layer, outer sidewalls of the dielectric masking layer, and outer sidewalls of the conductive layer are aligned.

19. The method of claim 17, wherein after the etching process outer sidewalls of the conductive layer are spaced laterally between outer sidewalls of the dielectric masking layer.

20. The method of claim 17, further comprising:
forming a bond bump structure over the conductive layer, wherein the bond bump structure continuously extends from above a top surface of the conductive layer.

* * * * *